(12) United States Patent
Yano et al.

(10) Patent No.: US 11,491,517 B2
(45) Date of Patent: Nov. 8, 2022

(54) METHOD AND SYSTEM FOR CLEANING COPPER-EXPOSED SUBSTRATE

(71) Applicant: ORGANO CORPORATION, Tokyo (JP)

(72) Inventors: Daisaku Yano, Tokyo (JP); Masami Murayama, Tokyo (JP); Yukinari Yamashita, Tokyo (JP); Koji Yamanaka, Tokyo (JP)

(73) Assignee: ORGANO CORPORATION, Tokyo (JP)

( * ) Notice: Subject to any disclaimer, the term of this patent is extended or adjusted under 35 U.S.C. 154(b) by 598 days.

(21) Appl. No.: 16/556,633

(22) Filed: Aug. 30, 2019

(65) Prior Publication Data

US 2019/0381539 A1 Dec. 19, 2019

Related U.S. Application Data

(62) Division of application No. 14/783,253, filed as application No. PCT/JP2014/060902 on Apr. 17, 2014, now Pat. No. 10,434,546.

(30) Foreign Application Priority Data

Apr. 30, 2013 (JP) ................................. 2013-095579

(51) Int. Cl.
*B08B 3/08* (2006.01)
*C02F 1/32* (2006.01)
(Continued)

(52) U.S. Cl.
CPC ................ *B08B 3/08* (2013.01); *B01J 31/08* (2013.01); *C02F 1/32* (2013.01); *C02F 9/00* (2013.01);
(Continued)

(58) Field of Classification Search
CPC ......... B08B 3/08; B08B 3/10; B08B 2203/00; B08B 2203/002; B01J 31/08; B01J 23/44;
(Continued)

(56) References Cited

U.S. PATENT DOCUMENTS 5,068,040 A * 11/1991 Jackson .................... B08B 3/12
134/1
6,764,552 B1 * 7/2004 Joyce ....................... C11D 7/02
257/E21.255
(Continued)

FOREIGN PATENT DOCUMENTS

CN 1881538 12/2006
GB 2343637 * 5/2000 ................ B01F 3/04
(Continued)

OTHER PUBLICATIONS

International Search Report issued in PCT/JP2014/060902, dated Jul. 1, 2014.
(Continued)

*Primary Examiner* — Joseph W Drodge
(74) *Attorney, Agent, or Firm* — Greenblum & Bernstein, P.L.C.

(57) ABSTRACT

The water outlet of a subsystem that includes an ultraviolet oxidation device and the water inlet of each substrate treatment device are connected to each other via a main pipe. A hydrogen peroxide removal device is installed between the ultraviolet oxidation device of the subsystem and a non-regenerative ion-exchange device. In addition, a carbon dioxide supply device is installed at the middle of a pipe that branches from the water outlet of the subsystem to reach the substrate treatment device. According to an aspect, the hydrogen peroxide removal device is filled with a platinum-group metal catalyst. Thus, ultrapure water passed through the ultraviolet oxidation device is used as a base to produce carbonated water in which the concentration of hydrogen
(Continued)

peroxide dissolved therein is limited to 2 μg/L or less and to which carbon dioxide is added to adjust resistivity to be within the range of 0.03 to 5.0 MΩ·cm.

7 Claims, 10 Drawing Sheets

(51) Int. Cl.
  *H01L 21/02* (2006.01)
  *B01J 31/08* (2006.01)
  *C02F 9/00* (2006.01)
  *C23G 1/10* (2006.01)
  *C23G 1/20* (2006.01)
  *C11D 7/02* (2006.01)
  *H01L 21/67* (2006.01)
  *C02F 1/20* (2006.01)
  *C02F 1/42* (2006.01)
  *C02F 1/44* (2006.01)
  *C02F 1/68* (2006.01)
  *C02F 103/04* (2006.01)

(52) U.S. Cl.
  CPC ............... *C11D 7/02* (2013.01); *C23G 1/103* (2013.01); *C23G 1/20* (2013.01); *H01L 21/02068* (2013.01); *H01L 21/6704* (2013.01); *C02F 1/20* (2013.01); *C02F 1/42* (2013.01); *C02F 1/44* (2013.01); *C02F 1/68* (2013.01); *C02F 2103/04* (2013.01)

(58) Field of Classification Search
  CPC .. B01J 2523/824; B01J 2531/824; C02F 1/32; C02F 9/00; C02F 1/20; C02F 1/42; C02F 1/44; C02F 1/68; C02F 2103/04; C02F 2209/05; C11D 7/02; C23G 1/103; C23G 1/20; H01L 21/02068; H01L 21/6704; B01D 19/00; B01D 19/0073; B01D 2253/112; B01D 2253/1122; B01D 2255/102; B01D 2255/1023
  See application file for complete search history.

(56) References Cited

U.S. PATENT DOCUMENTS

| | | | |
|---|---|---|---|
| 6,786,976 | B1 | 9/2004 | Gottshalk |
| 8,628,659 | B1 | 1/2014 | Taylor, III |
| 2002/0102852 | A1 | 8/2002 | Verhaverbeke |
| 2003/0094610 | A1 | 5/2003 | Aoki et al. |
| 2006/0144419 | A1 | 7/2006 | Weber |
| 2007/0240740 | A1 | 10/2007 | McDermott |
| 2009/0023231 | A1 | 1/2009 | Ohmi et al. |
| 2009/0127201 | A1* | 5/2009 | Kobayashi .......... B01J 35/0013 210/749 |
| 2011/0210072 | A1 | 9/2011 | Kobayashi |
| 2012/0108074 | A1* | 5/2012 | Kinoshita ......... H01L 21/31111 438/745 |
| 2014/0038398 | A1* | 2/2014 | Heo .................. H01L 21/02068 438/585 |
| 2014/0202496 | A1* | 7/2014 | Miyagi ............... H01L 21/6704 134/99.1 |

FOREIGN PATENT DOCUMENTS

| | | |
|---|---|---|
| JP | 4-206724 | 7/1992 |
| JP | 2003-136077 | 5/2003 |
| JP | 2004-079649 | 3/2007 |
| JP | 2010-240641 | 1/2010 |
| JP | 2010-56218 | 3/2010 |
| JP | 2010-069460 | 4/2010 |
| WO | 2007/088848 | 8/2007 |

OTHER PUBLICATIONS

Machine translation (dated Jan. 10, 2017) of JP5329463 (not dated) provided by Examiner in Restriction dated Jan. 25, 2017.

* cited by examiner

METHOD AND SYSTEM FOR CLEANING COPPER-EXPOSED SUBSTRATE

CROSS REFERENCE TO RELATED APPLICATION

This is a divisional application of U.S. patent application Ser. No. 14/783,253, filed Oct. 8, 2015, which is a National Phase application of International Application No. PCT/JP2014/060902, filed on Apr. 17, 2014, which claims the benefit of Japanese Patent Application No. 2013-095579, filed on Apr. 30, 2013. The disclosure of each of these documents, including the specification, drawings, and claims, is incorporated herein by reference in its entirety.

TECHNICAL FIELD

The present invention relates to a treatment method of a copper-exposed substrate. More particularly, the invention relates to a method used for cleaning and treating a substrate having copper or a copper compound exposed, and a cleaning system thereof. The substrates to be cleaned include, for example, a semiconductor wafer in which a semiconductor integrated circuit is formed, a substrate for a liquid crystal display device, a substrate for a plasma display, a substrate for a field emission display, a substrate for an optical disk, a substrate for a magnetic disk, a substrate for a magneto-optical disk, a substrate for a photomask, and a ceramic substrate.

BACKGROUND ART

Market demand exists for semiconductor integrated circuit elements having higher integration and higher speed. In order to meet this demand, lower-resistance copper wiring has been used in place of conventionally-used aluminum wiring. By combining the copper wiring with a low dielectric constant insulating film (so-called low-k film: insulating film made of material whose dielectric constant is lower than that of silicon oxide) to form multilayer wiring, an integrated circuit element that operates at an extremely high speed can be achieved.

In the manufacturing process of such an integrated circuit element, performing cleaning for the purpose of removing a chemical solution, fine particles, organic substances, and metals attached to the surface of a body to be treated, such as a wafer or a substrate, to achieve and maintain high cleanliness is important for maintaining product quality and enhancing the yield. For example, after treatment with a chemical solution such as a sulfuric acid/hydrogen peroxide mixture or a hydrofluoric acid solution, cleaning with ultrapure water is carried out. In recent years, because of the miniaturization of semiconductor devices, the diversity of materials, and complex processes, the number of cleaning times has been increased. In the formation of the above-mentioned multilayer wiring, the following steps are repeated: forming metal wiring that is a first wiring layer on the substrate; covering the metal wiring with an insulating material; polishing the surface of the insulating material that covers the metal wiring by CMP until it becomes flat; forming metal wiring that is a second wiring layer on the surface; covering the metal wiring with an insulating material; and polishing the surface of the insulating material by CMP until it becomes flat. In such a process, substrate cleaning is carried out after each polishing step.

For the production of the ultrapure water used for the cleaning, generally, an ultrapure water production device shown in FIG. 1 including a pretreatment system, a primary pure water system, and a secondary pure water system (hereinafter, referred to as subsystem) is used. The role of each system in the ultrapure water production device is as follows. The pretreatment system corresponds to a step for removing suspended matters and colloid substances contained in raw water through, for example, coagulation settling and sand filtration. The primary pure water system corresponds to a step for obtaining primary pure water by removing, through the use of, for example, an ion-exchange resin and a reverse osmosis (RO) membrane, ionic components and organic components contained in the raw water from which the suspended matters and the like has been removed by the pretreatment system. The subsystem corresponds to, as shown in FIG. 2, a step for producing ultrapure water by further increasing the purity of the primary pure water obtained by the primary pure water system through the use of a water passage line in which an ultraviolet oxidation device (UV), a non-regenerative ion-exchange device (e.g., cartridge polisher (CP)), a membrane separation device (e.g., ultrafiltration device (UF)), and the like are continuous. The ultrapure water supplied from the subsystem is fed to a substrate cleaning device such as a batch type substrate cleaning device or a single-wafer type substrate cleaning device, or to a substrate treatment device such as a CMP device, and unused ultrapure water is returned to the inlet of the subsystem or the primary pure water system to be reused.

When the ultrapure water thus obtained is used as cleaning water for the semiconductor substrate, if the concentration of dissolved oxygen in the cleaning water is high, a natural oxide film is easily formed on the wafer surface by the cleaning water. This may block the precise control of the film thickness and the film quality of a gate oxide film, or increase the contact resistance of a contact hole, a via, a plug, or the like. In addition, a wiring metal such as tungsten or copper is exposed on the surface of the substrate that is to be cleaned after the polishing step in the formation process of the multilayer wiring. Since this wiring metal is easily corroded by the oxygen dissolved in the cleaning water, the wiring may be subjected to oxidation corrosion during the substrate cleaning which causes deterioration in the performance of the integrated circuit element that is to be created from the substrate.

As a countermeasure, a membrane degasifier (MD) may be installed in the subsystem for the purpose of removing gas components, in particular oxygen, dissolved in the ultrapure water. In general, the membrane degasifier is often installed between the ultraviolet oxidation device and the non-regenerative ion-exchange device (FIG. 3), or between the non-regenerative ion-exchange device and the membrane separation device (FIG. 4). The former case has an advantage in which impurities (ions) eluted from the membrane degasifier can be removed by the non-regenerative ion-exchange device. The latter case has an advantage in which the very small amount of gas components generated by the non-regenerative ion-exchange device can be removed by the membrane degasifier.

As another countermeasure, as described in Patent Literature 1, there has been proposed a method for reducing the dissolved oxygen in the water by adding inactive gas to the degassed ultrapure water. In Patent Literature 1, a method for replacing an atmosphere near the surface of the substrate to be cleaned with inactive gas is also employed. In addition, Patent Literature 2 discloses a method for dissolving hydrogen gas in the ultrapure water to prevent the oxidation of the substrate.

In the above-mentioned subsystem, since the water is irradiated with ultraviolet rays to decompose/remove the organic substances in the water by the ultraviolet oxidation device, water molecules are also oxidized by the ultraviolet irradiation to generate hydrogen peroxide that is an oxidizer. This means that the ultrapure water includes hydrogen peroxide.

As a method for removing the hydrogen peroxide in the water, a technology to remove hydrogen peroxide in the water by a platinum-group metal catalyst, such as palladium, as described in Patent Literature 2, is known. In particular, Patent Literature 3 proposes a method for highly efficiently decomposing and removing the hydrogen peroxide from the raw water at a high speed by bringing a catalyst prepared by supporting a platinum-group metal on a monolithic organic porous anion exchanger into contact with the raw water including the hydrogen peroxide. In the method for removing the hydrogen peroxide by the platinum-group metal catalyst such as palladium, as described in Patent Literature 2, it is known that the hydrogen peroxide and the dissolved oxygen can be simultaneously removed by dissolving the hydrogen before the water passes through the platinum-group metal catalyst.

Since the impurities have been removed, to the maximum degree, from the ultrapure water obtained by the above-mentioned subsystem, its resistivity reaches 18 MΩ·cm or more and has high insulation properties. When a substrate such as a semiconductor wafer is cleaned with the ultrapure water that has such high resistivity, charging of the substrate result from friction which causes fine particles attached to the substrate due to electrostatic attraction or which causes electrostatic destruction of elements due to discharging. As a countermeasure, as described in Patent Literature 4, a method for reducing the resistivity of water by adding highly pure carbon dioxide to the ultrapure water and using this carbon dioxide added water (i.e., carbonated water) as a cleaning solution is employed.

The properties of the carbonated water are different from those of the ultrapure water in that the resistivity is low and pH exhibits mild acidity due to a high carbonic acid concentration as described above. Accordingly, for example, when the carbonated water is used as cleaning water, it is known that a problem, in which copper exposed on the substrate surface is dissolved, occurs. With further miniaturization of the pattern dimensions of the integrated circuit element, the thickness of the wiring becomes smaller, creating a possibility that even slight wiring corrosion may reduce the performance of the integrated circuit element in the future.

Thus, as described in examples herein, the inventors have analyzed the test for cleaning the copper-exposed substrate with the carbonated water, and found that hydrogen peroxide contained in the carbonated water contributes to the corrosion progress of the copper. In the above-mentioned subsystem, the hydrogen peroxide is generated in the water by the ultraviolet oxidation device, and it has been found for the first time that this hydrogen peroxide is the cause of the corrosion.

In other words, the inventors have found that when the substrate is cleaned with the carbonated water prepared based on the ultrapure water irradiated with ultraviolet rays, the removal of the hydrogen peroxide in the carbonated water is effective for further preventing the corrosion of the copper or the copper compound exposed on the substrate surface.

CITATION LIST

Patent Literature

Patent Literature 1: JP 2010-56218 A
Patent Literature 2: JP 2003-136077 A
Patent Literature 3: JP 2010-240641 A
Patent Literature 4: JP H04-206724 A

SUMMARY OF INVENTION

The present invention has been made based on the above-mentioned analysis result, and its object is to provide a method and system for cleaning a copper-exposed substrate capable of preventing the substrate from being charged and further preventing the corrosion and dissolution of copper exposed on a substrate surface.

An aspect of the present invention relates to a method for cleaning a copper-exposed substrate. The method includes cleaning the substrate having at least copper or a copper compound exposed on a surface with carbonated water in which the concentration of hydrogen peroxide dissolved in water is limited to 2 or less and to which carbon dioxide is added to adjust resistivity to be within the range of 0.03 to 5.0 MΩ·cm.

Another aspect of the present invention relates to a system for cleaning a copper-exposed substrate. The system includes an ultrapure water production device that includes an ultraviolet oxidation device for irradiating water with ultraviolet rays, a treatment chamber in which a substrate having at least copper or a copper compound exposed on a surface is disposed and to which a substrate treatment solution for cleaning the substrate is supplied, and means for producing, as a treatment solution for the substrate, carbonated water in which the concentration of hydrogen peroxide dissolved in water is limited to 2 μg/L or less and to which carbon dioxide is added to adjust resistivity to be within the range of 0.03 to 5.0 MΩ·cm in a flow path from the ultraviolet oxidation device of the ultrapure water production device to a treatment solution discharging part of the treatment chamber.

According to the aspects of the method and system, since the copper-exposed substrate is cleaned with the carbonated water adjusted to the above-mentioned hydrogen peroxide concentration and the above-mentioned resistivity, the charging of the substrate can be prevented, and the corrosion and dissolution of the copper exposed on the substrate surface can be further prevented than the case of using conventional technology.

According to the present invention, the charging of the substrate can be prevented, and the corrosion and dissolution of the copper or the copper compound that is exposed on the substrate surface by the carbonated water can be further prevented than the case of using conventional technology. Therefore, substrate treatment, which makes any reduction in the performance of manufactured integrated circuit elements difficult, can be provided.

BRIEF DESCRIPTION OF DRAWINGS

FIG. 22-1*b* is the SPM image of the sample subjected to 16-hour cleaning according to Example 1 (less than hydrogen peroxide concentration 2 μg/L);

FIG. 22-2*a* is the SEM image of a sample subjected to 16-hour cleaning according to Comparative Example 1 (hydrogen peroxide concentration 15 μg/L);

FIG. 22-2*b* is the SPM image of the sample subjected to 16-hour cleaning according to Comparative Example 1 (hydrogen peroxide concentration 15 μg/L);

DESCRIPTION OF EMBODIMENTS

Next, the present invention will be described with reference to the drawings.

Various embodiments described below are directed to the cleaning of a substrate installed in the treatment chamber of a substrate treatment device by using carbonated water obtained by adding carbon dioxide to ultrapure water produced in a subsystem that includes an ultraviolet oxidation device. The substrate to be cleaned includes a semiconductor wafer and the like having at least copper or a copper compound that is exposed.

First Embodiment

Figure 5:
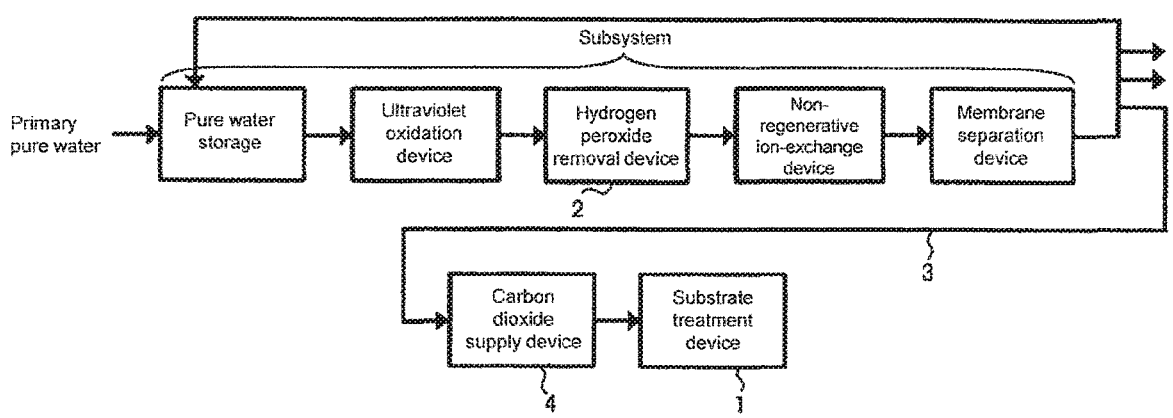
FIG. 5 is a schematic diagram showing an aspect of a substrate treatment method according to a first embodiment of the present invention.

FIG. 5 is a schematic diagram showing an aspect of a substrate cleaning method according to a first embodiment of the present invention. The water outlet of a subsystem and the water inlet of each substrate treatment device are connected to each other via a main pipe made of PVC, PEA or the like that is mainly used at a semiconductor manufacturing line. A treatment chamber (not shown) is installed in substrate treatment device 1, and cleaning water is supplied thereto. The number of substrate treatment devices 1 may be one or more, and each substrate treatment device 1 may include one or more treatment chambers. The treatment chamber is provided with a mechanism for holding the substrate. The mechanism may be either a single-wafer type in which carbonated water is sprayed to one substrate in order to treat it or a batch type in which a plurality of substrates are dipped into a tank that stores the carbonated water in order to treat the substrates.

Figure 1:
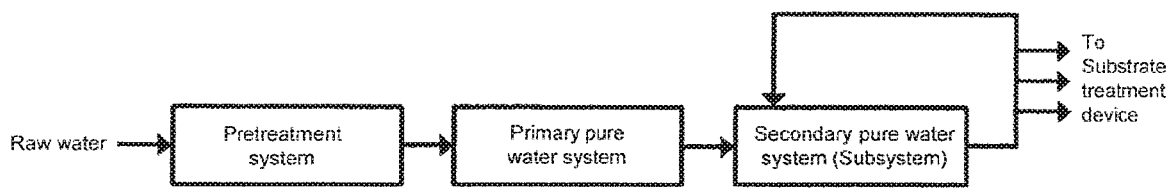
FIG. 1 is a schematic diagram showing a general aspect of an ultrapure water production device.
Figure 2:
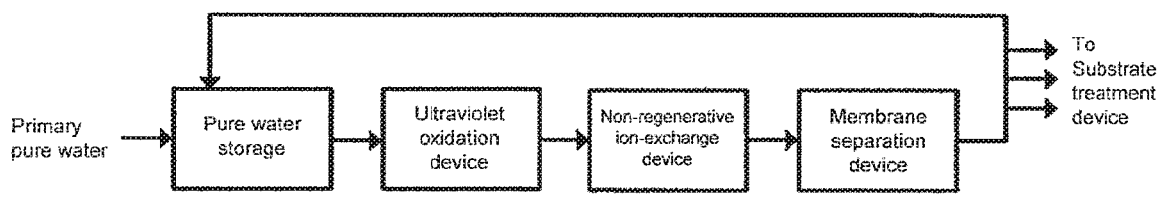
FIG. 2 is a schematic diagram showing a general aspect of a subsystem.

In the aspect shown in FIG. 5, hydrogen peroxide removal device 2 is installed between the ultraviolet oxidation device and the non-regenerative ion-exchange device of the subsystem shown in FIG. 2. In addition, carbon dioxide supply device 4 is installed at the middle of pipe 3 that branches from the water outlet of the subsystem to reach substrate treatment device 1.

According to an aspect, hydrogen peroxide removal device 2 is filled with a platinum-group metal catalyst. Examples of such a device include a catalyst unit filled with a palladium catalyst, and a catalyst unit in which a palladium catalyst is supported on a monolithic organic porous anion exchanger. More detailed specific examples of the platinum-group metal catalyst will be described below.

Preferably, by passing water, that has been passed through the ultraviolet oxidation device, through the platinum-group metal catalyst of hydrogen peroxide removal device 2, water in which the concentration of hydrogen peroxide is 2 μg/L or less can be obtained.

Carbon dioxide supply device 4 is configured to add carbon dioxide so as to adjust the resistivity of the water (carbonated water) after adding carbon dioxide to be within the range of 0.03 MΩ·cm to 5.0 MΩ·cm. As a means for adding it, a membrane dissolution system is preferably used.

The water obtained by this aspect is carbonated water in which the hydrogen peroxide is reduced so that the concentration of hydrogen peroxide is 2 μg/L or less and to which the carbon dioxide is added so that the resistivity is adjusted to be within the range of 0.03 MΩ·cm to 5.0 MΩ·cm. When this carbonated water is supplied as cleaning water to substrate treatment device 1 to be used for cleaning the substrate, the dissolution of copper that is exposed on the substrate surface can be further prevented than the case of using carbonated water in which the concentration of hydrogen peroxide is not limited to 2 μg/L or less. This is based on the evaluation result shown in Examples described below.

Installing hydrogen peroxide removal device 2 downstream of the ultraviolet oxidation device enables removal of the hydrogen peroxide generated by the ultraviolet oxidation device. In addition, installing hydrogen peroxide removal device 2 upstream of the non-regenerative ion-exchange device enables removal of the very small amount of impurities (ions) eluted from hydrogen peroxide removal device 2.

Figure 3:
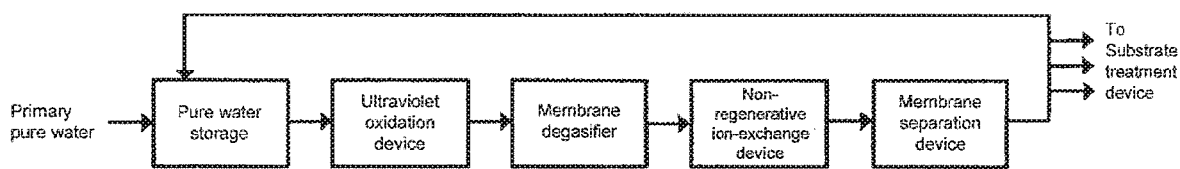
FIG. 3 is a schematic diagram showing a general aspect of the subsystem.
Figure 6:
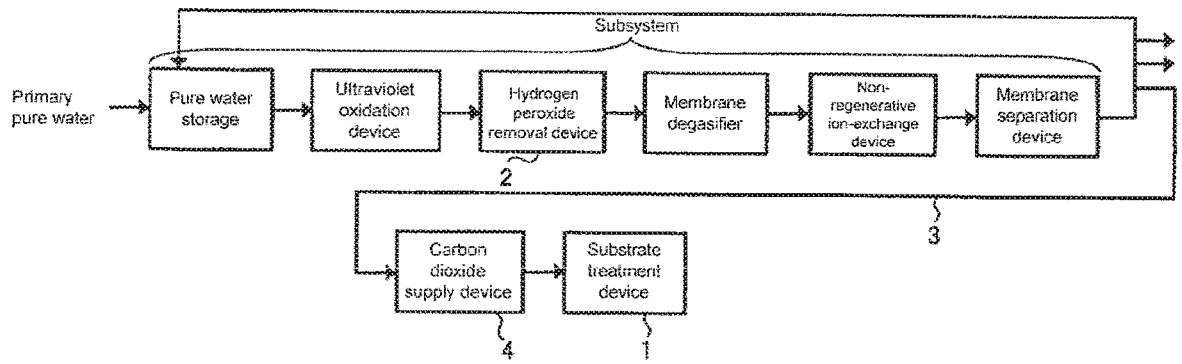
FIG. 6 is a schematic diagram showing an aspect of the substrate treatment method according to the first embodiment of the present invention.

FIG. 6 shows another aspect of this embodiment. In the aspect shown in FIG. 6, hydrogen peroxide removal device 2 is installed between the ultraviolet oxidation device and the membrane degasifier of the subsystem shown in FIG. 3. Accordingly, the gas components generated at hydrogen peroxide removal device 2 can be removed.

Figure 4:
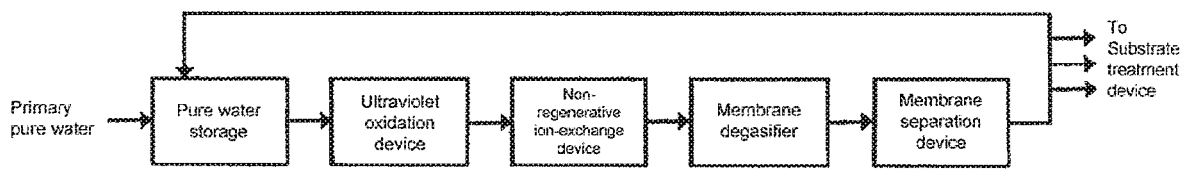
FIG. 4 is a schematic diagram showing a general aspect of the subsystem.
Figure 7:
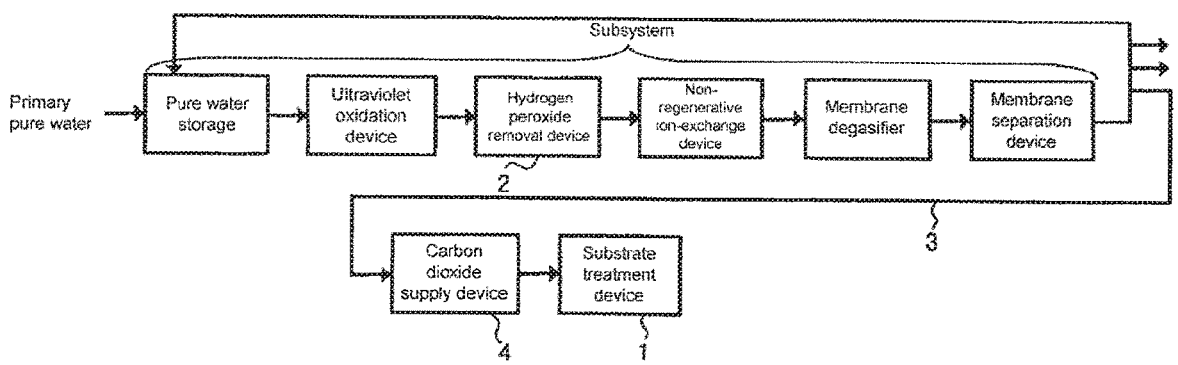
FIG. 7 is a schematic diagram showing an aspect of the substrate treatment method according to the first embodiment of the present invention.

FIG. 7 shows yet another aspect of this embodiment. In the aspect shown in FIG. 7, hydrogen peroxide removal device 2 is installed between the ultraviolet oxidation device and the non-regenerative ion-exchange device of the subsystem shown in FIG. 4. Installing a membrane degasifier downstream of the non-regenerative ion-exchange device enables removal of gas components generated at hydrogen peroxide removal device 2 and at the non-regenerative ion-exchange device.

By installing hydrogen peroxide removal device 2 in the subsystem, this embodiment eliminates the need to install hydrogen peroxide removal device 2 for each substrate treatment device, and thus provides an advantage in which installation costs can be reduced.

During the substrate cleaning, it is desired that the treatment chamber of substrate treatment device 1 be filled with inactive gas so that the concentration of oxygen gas is 2% or less in the treatment chamber. As the inactive gas, nitrogen gas may be preferably used from an economic standpoint. This is based on the test result in Examples described below.

In addition, during the substrate cleaning, it is desired that the treatment chamber of substrate treatment device 1 be shielded from light. This is based on the test result shown in Examples described below.

Second Embodiment

As described above, the passage of the water, to which the hydrogen has been added beforehand, through the platinum-group metal catalyst enables removal of not only the hydrogen peroxide but also dissolved oxygen. As will be described in detail in Examples, it has been found that even during substrate cleaning with carbonated water, removal of dissolved oxygen in the carbonated water prevents the elution of copper. This embodiment is based on this knowledge.

Figure 8:
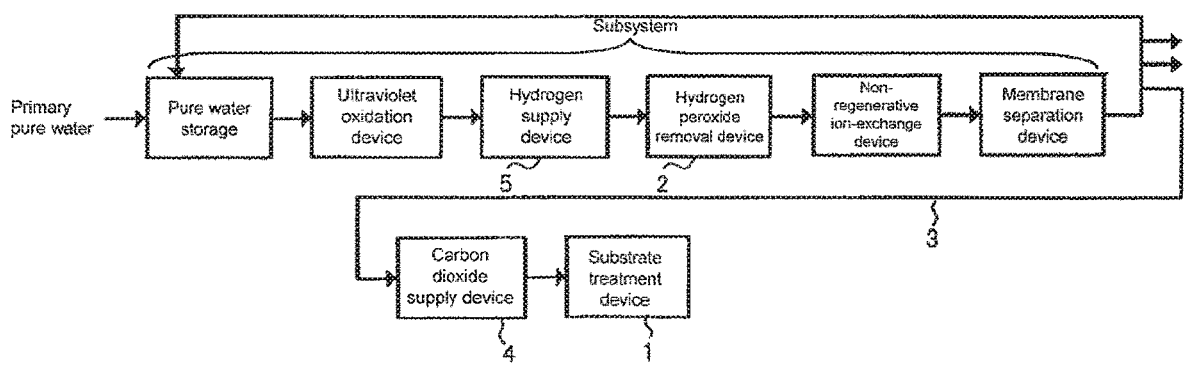
FIG. 8 is a schematic diagram showing an aspect of a substrate treatment method according to a second embodiment of the present invention.

FIG. 8 is a schematic diagram showing an aspect of a substrate cleaning method according to a second embodiment of the present invention. The water outlet of a subsystem and the water inlet of each substrate treatment device are connected to each other via a main pipe made of PVC, PFA or the like that is mainly used at a semiconductor manufacturing line. A treatment chamber (not shown) is installed in substrate treatment device 1, and cleaning water is supplied thereto. The number of substrate treatment devices 1 may be one or more, and each substrate treatment device 1 may include one or more treatment chambers. The treatment chamber is provided with a mechanism for holding the substrate. The mechanism may be either a single-wafer type in which carbonated water is sprayed to one substrate in order to treat it or a batch type in which a plurality of substrates are dipped into a tank that stores the carbonated water in order to treat the substrates.

In the aspect shown in FIG. 8, hydrogen supply device 5 and hydrogen peroxide removal device 2 are installed in this order in a water supply direction between the ultraviolet oxidation device and the non-regenerative ion-exchange device of the subsystem shown in FIG. 2. In addition, carbon dioxide supply device 4 is installed at the middle of pipe 3 that branches from the water outlet of the subsystem to reach substrate treatment device 1. When hydrogen is added to water by hydrogen supply device 5 and the water is passed through hydrogen peroxide removal device 2, the hydrogen reacts with dissolved oxygen in the water to produce water at hydrogen peroxide removal device 2. Accordingly, the concentration of dissolved oxygen in ultrapure water can be further reduced. In other words, hydrogen peroxide removal device 2 can simultaneously remove hydrogen peroxide and oxygen.

According to an aspect, hydrogen peroxide removal device 2 is filled with a platinum-group metal catalyst, Examples of such a device include catalyst unit filled with a palladium catalyst, and a catalyst unit in which a palladium catalyst is supported on a monolithic organic porous anion exchanger. More detailed specific examples of the platinum-group metal catalyst will be described below.

Figure 9:
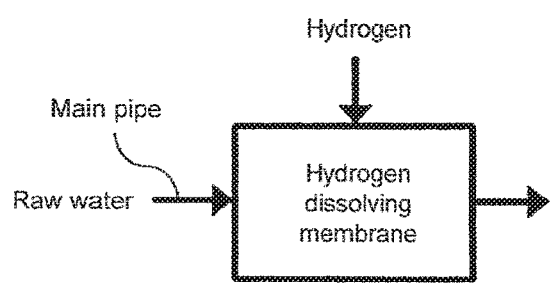
FIG. 9 is a schematic diagram showing an aspect of a hydrogen dissolution device.
Figure 10:
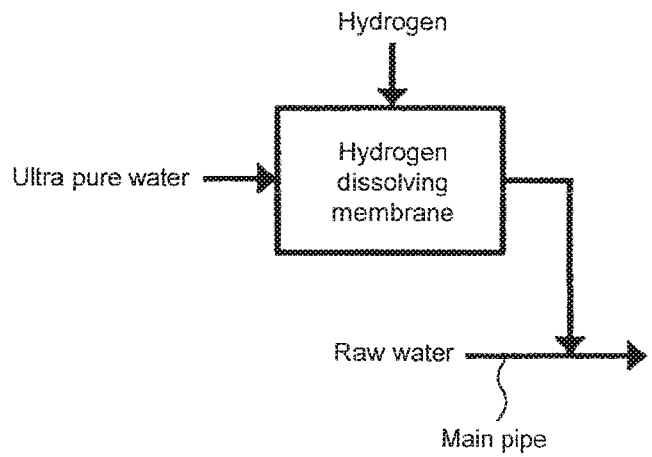
FIG. 10 is a schematic diagram showing an aspect of the hydrogen dissolution device.
Figure 11:
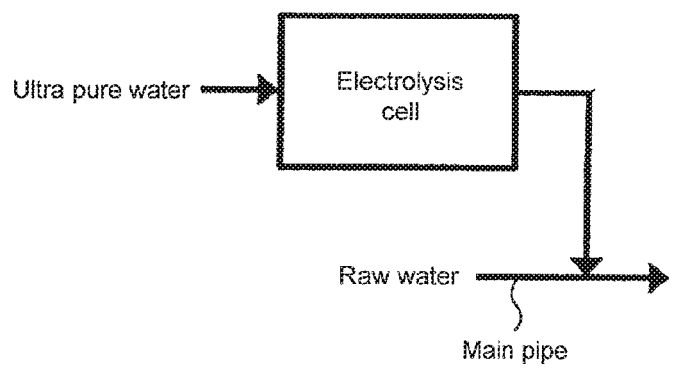
FIG. 11 is a schematic diagram showing an aspect of the hydrogen dissolution device.

If hydrogen supply device 5 employs a method for adding hydrogen to water, it is not limited to any particular method. For example, the method shown in FIG. 9 for installing a hydrogen dissolving membrane in the main pipe to add hydrogen gas can be used. In addition, the method shown in FIG. 10 for supplying hydrogen water produced by adding hydrogen gas to the ultrapure water by using the hydrogen dissolving membrane to the main pipe can also be used. As shown in FIG. 11, the method for extracting hydrogen-contained cathode water obtained through the electrolysis of the ultrapure water carried out by using an electrolysis cell to supply it to the main pipe can also be used. It is desired for removal of the dissolved oxygen to add hydrogen so that the concentration of hydrogen is set to 1 or more with respect to 8 of the concentration of dissolved oxygen.

Preferably, by passing water, that has been passed through the ultraviolet oxidation device, through the platinum-group metal catalyst of hydrogen peroxide removal device 2, water in which the concentration of hydrogen peroxide is 2 μg/L or less can be obtained.

Carbon dioxide supply device 4 is configured to add carbon dioxide so as to adjust the resistivity of the water (carbonated water) after adding carbon dioxide to be within the range of 0.03 MΩ·cm to 5.0 MΩ·cm. As a means for adding it, a membrane dissolution system is preferably used.

The water obtained by this aspect is carbonated water in which the concentration of hydrogen peroxide is reduced to 2 μg/L or less and the concentration of dissolved oxygen is reduced to 2 μg/L or less and to which the carbon dioxide is added so that the resistivity is adjusted to be within the range of 0.03 MΩ·cm to 5.0 MΩ·cm. When this carbonated water is supplied as cleaning water to substrate treatment device 1 to be used for cleaning the substrate, the dissolution of that is copper exposed on the substrate surface can be prevented than the case of using carbonated water in which the concentration of hydrogen peroxide is not limited to 2 μg/L or less. This is based on the evaluation result shown in Examples described below.

This aspect also provides an advantage in which membrane degasifiers are not needed, since the dissolved oxygen can be removed by hydrogen peroxide removal device 2.

Figure 12:
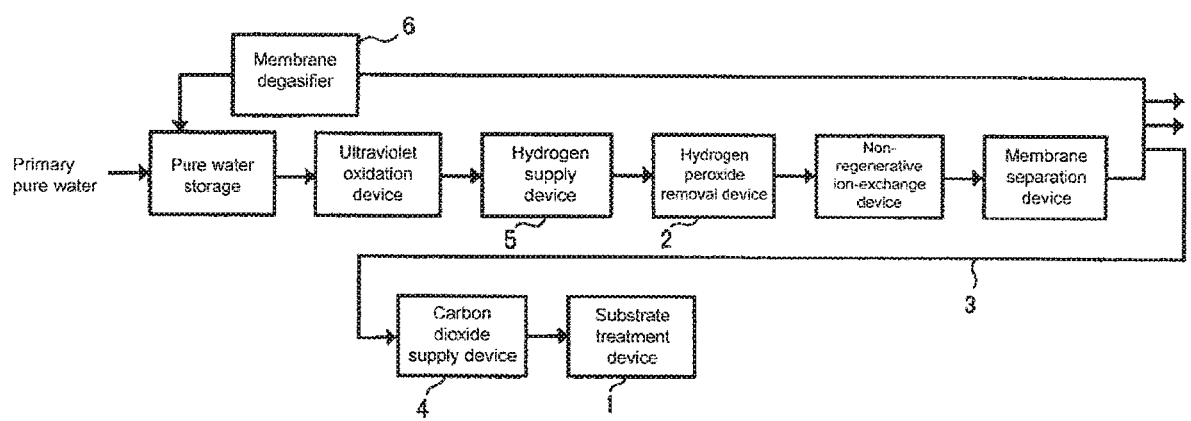
FIG. 12 is a schematic diagram showing an aspect of the substrate treatment method according to the second embodiment of the present invention.

FIG. 12 shows another aspect of this embodiment. In the aspect shown in FIG. 12, compared with the aspect shown in FIG. 8, membrane degasifier 6 is installed at the middle of a line to return unused ultrapure water to a subsystem inlet or a primary pure water system. Membrane degasifier 6 is installed to prevent the added hydrogen from being accumulated in the circulated ultrapure water.

By installing hydrogen supply device 5 and hydrogen peroxide removal device 2 in the subsystem, this embodiment eliminates the need to install hydrogen supply device 5 and hydrogen peroxide removal device 2 for each substrate treatment device, and thus provides an advantage in which installation costs can be reduced.

During the substrate cleaning, it is desired that the treatment chamber of substrate treatment device 1 be filled with inactive gas so that the concentration of oxygen gas to 2% or less in the treatment chamber. As the inactive gas, nitrogen gas may be preferably used from an economic standpoint. This is based on the test result shown in Examples described below.

In addition, during the substrate cleaning, it is desired that the treatment chamber of substrate treatment device 1 be shielded from light. This is based on the test result shown in Examples described below.

Third Embodiment

Figure 13:
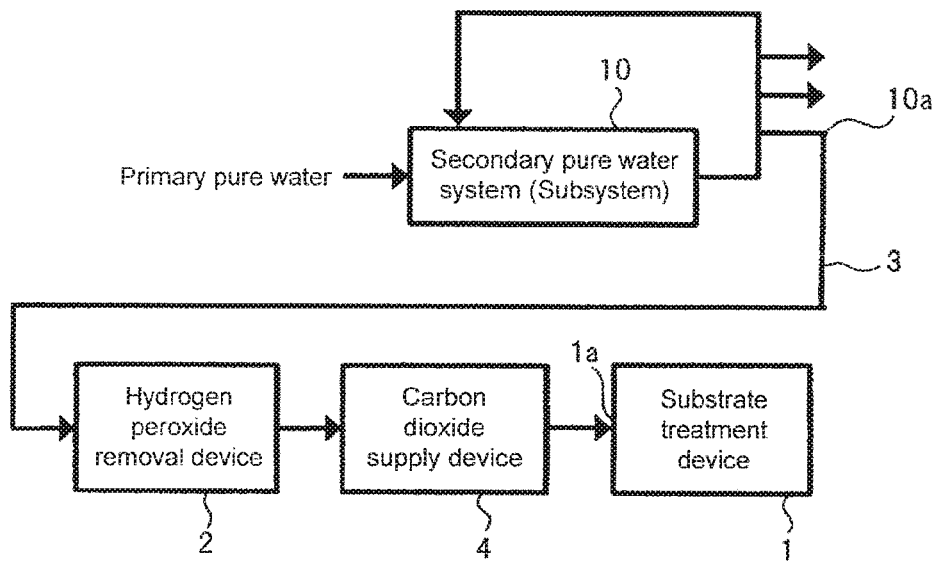
FIG. 13 is a schematic diagram showing an aspect of a substrate treatment method according to a third embodiment of the present invention.

FIG. 13 is a schematic diagram showing an aspect of a substrate cleaning method according to a third embodiment of the present invention. Subsystem 10 shown in FIG. 13 is the same as any one of the subsystems shown in FIGS. 2 to 4, and components such as an ultraviolet oxidation device, a non-regenerative ion-exchange device, a membrane separation device, and a membrane degasifier are not shown. The water outlet of the subsystem and the water inlet of each substrate treatment device are connected to each other via a main pipe made of PVC, PEA or the like that is mainly used at a semiconductor manufacturing line. A treatment chamber (not shown) is installed in substrate treatment device 1, and cleaning water is supplied thereto. The number of substrate treatment devices 1 may be one or more, and each substrate treatment device 1 may include one or more treatment chambers. The treatment chamber is provided with a mechanism for holding the substrate. The mechanism may be either a single-wafer type in which carbonated water is sprayed to one substrate in order to treat it or a batch type in which a plurality of substrates are dipped into a tank that stores the carbonated water in order to treat the substrates.

In the aspect shown in FIG. 13, hydrogen peroxide removal device 2 and carbon dioxide supply device 4 are installed in this order in a water supply direction between water outlet 10a of the subsystem and water inlet 1a of the substrate treatment device. This provides an advantage in which hydrogen peroxide removal device 2 and carbon dioxide supply device 4 can be installed only in substrate treatment device 1 that requires carbonated water in which the concentration of hydrogen peroxide has been reduced. In addition, since the configuration of subsystem 10 is the same as the conventional case, there is also an advantage in which changing existing facilities is unnecessary.

As in the case of the first embodiment, a platinum-group metal catalyst is used for hydrogen peroxide removal device 2. Examples of such a device include a catalyst column filled with a palladium catalyst, and a catalyst column in which a palladium catalyst is supported on a monolithic organic porous anion exchanger can be used. In particular, the catalyst column in which the palladium catalyst is supported on the monolithic organic porous anion exchanger is much smaller than a catalyst column in which a palladium catalyst is supported on a granular ion exchanger, and is thus suitable for the aspect in which hydrogen peroxide removal device 2 is an accessory to substrate treatment device 1. More detailed specific examples of the platinum-group metal catalyst will be described below.

Figure 14:
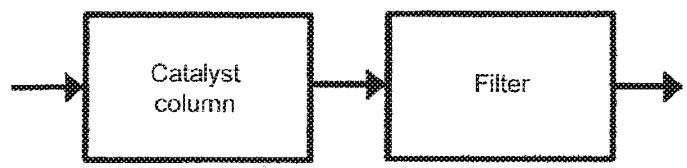
FIG. 14 is a schematic diagram showing an aspect of a hydrogen peroxide removal device.

In this aspect, as shown in FIG. 14, for the purpose of preventing fine particles from flowing out from the platinum-group metal catalyst, a configuration where a filter is disposed downstream of the catalyst column that is filled with the platinum-group metal catalyst is particularly preferably used. As the filter, a microfiltration membrane is preferably used. Further, for the purpose of preventing ionic components as well as the fine particles from flowing out, as a filter, an ion adsorption membrane, or a combination of the ion adsorption membrane and the microfiltration membrane is preferably disposed downstream of the catalyst column. The combination of a monolithic cation and/or anion exchanger and the microfiltration membrane is also preferably disposed downstream of the catalyst column.

The third embodiment provides the same effects as those of the first embodiment. Specifically, carbonated water in which hydrogen peroxide is reduced so that the concentration of hydrogen peroxide is 2 μg/L or less and to which carbon dioxide is added so that the resistivity is adjusted to be within the range of 0.03 MΩ·cm to 5.0 MΩ·cm is supplied to substrate treatment device 1. When this carbonated water is used for cleaning the substrate, the dissolution of copper that is exposed on the substrate surface can be further prevented than the case of using carbonated water in which the concentration of hydrogen peroxide is not limited to 2 μg/L or less. This is based on the evaluation result shown in Examples described below.

During the substrate cleaning, it is desired that the treatment chamber of substrate treatment device 1 be filled with inactive gas so that the concentration of oxygen gas is 2% or less in the treatment chamber. As the inactive gas, nitrogen gas may be preferably used from an economic standpoint. This is based on the test result shown in Examples described below.

In addition, during the substrate cleaning, it is desired that the treatment chamber of substrate treatment device 1 be shielded from light. This is based on the test result shown in Examples described below.

Fourth Embodiment

Figure 15:
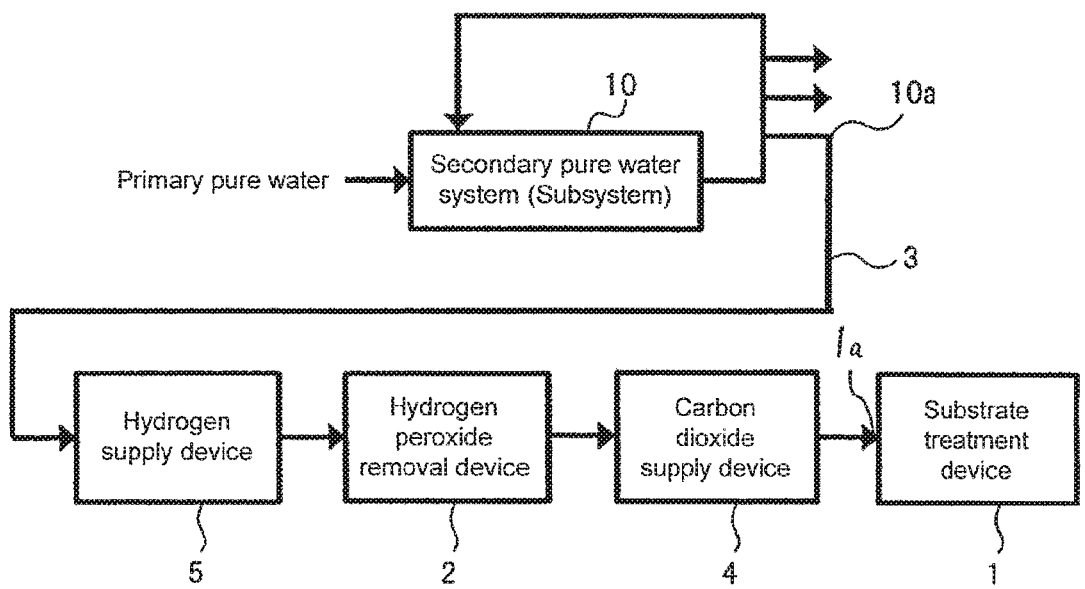
FIG. 15 is a schematic diagram showing an aspect of a substrate treatment method according to a fourth embodiment of the present invention.

FIG. 15 is a schematic diagram showing an aspect of a substrate cleaning method according to the third embodiment of the present invention. A subsystem shown in FIG. 15 is the same as any one of the subsystems shown in FIGS. 2 to 4, and components such as an ultraviolet oxidation device, a non-regenerative ion-exchange device, a membrane separation device, and a membrane degasifier are not shown. The water outlet of the subsystem and the water inlet of each substrate treatment device are connected to each other via a main pipe made of PVC, PFA or the like that is mainly used at a semiconductor manufacturing line. A treatment chamber (not shown) is installed in substrate treatment device 1, and cleaning water is supplied thereto. The number of substrate treatment devices 1 may be one or more, and each substrate treatment device 1 may include one or more treatment chambers. The treatment chamber is provided with a mechanism for holding the substrate. The mechanism may be either a single-wafer type in which carbonated water is sprayed to one substrate in order to treat it or a batch type in which a plurality of substrates are dipped into a tank that stores the carbonated water in order to treat the substrates.

In the aspect shown in FIG. 15, hydrogen supply device 5, hydrogen peroxide removal device 2, and carbon dioxide supply device 4 are installed in this order in a water supply direction between water outlet 10a of the subsystem and water inlet 1a of the substrate treatment device. This provides an advantage in which hydrogen supply device 5, hydrogen peroxide removal device 2, and carbon dioxide supply device 4 can be installed only in substrate treatment device 1 that requires carbonated water in which the concentration of hydrogen peroxide and the concentration of dissolved oxygen have been reduced. In addition, since the configuration of subsystem 10 is the same as the conventional case, there is also an advantage in which changing existing facilities is unnecessary.

As in the case of the second embodiment, a platinum-group metal catalyst is used for hydrogen peroxide removal device 2. Examples of such a device include a catalyst column filled with a palladium catalyst, and a catalyst column in which a palladium catalyst is supported on a monolithic organic porous anion exchanger can be used. In particular, the catalyst column in which the palladium catalyst is supported on the monolithic organic porous anion exchanger is much smaller than a catalyst column in which a palladium catalyst is supported on a granular ion exchanger, and is thus suitable for the aspect in which hydrogen peroxide removal device 2 is an accessory to substrate treatment device 1. More detailed specific examples of the platinum-group metal catalyst will be described below.

In this aspect, as shown in FIG. 14, for the purpose of preventing fine particles from flowing out from the platinum-group metal catalyst, a configuration where a filter is disposed downstream of the catalyst column that is filled with the platinum-group metal catalyst is particularly preferably used. As the filter, a microfiltration membrane is preferably used. Further, for the purpose of preventing ionic components as well as the fine particles from flowing out, as a filter, an ion adsorption membrane, or a combination of the ion adsorption membrane and the microfiltration membrane is preferably disposed downstream of the catalyst column. The combination of a monolithic cation and/or anion exchanger and the microfiltration membrane is also preferably disposed downstream of the catalyst column.

According to the fourth embodiment, carbonated water in which hydrogen peroxide is reduced so that the concentration of hydrogen peroxide is 2 μg/L or less and to which carbon dioxide is added so that the resistivity is adjusted to be within the range of 0.03 MΩ·cm to 5.0 MΩ·cm is supplied to substrate treatment device 1. When this carbonated water is used for cleaning the substrate, the dissolution of copper that is exposed on the substrate surface can be further prevented than the case of using carbonated water in which the concentration of hydrogen peroxide is not limited to 2 μg/L or less.

Further, according to the fourth embodiment, dissolved oxygen can be removed as in the case of the above-mentioned second embodiment. However, compared with the second embodiment, hydrogen peroxide removal device 2 is installed near substrate treatment device 1. Accordingly, compared with the second embodiment, even when oxygen is dissolved inside the pipe extending from the subsystem to substrate treatment device 1 from the pipe, form joint parts or form the like to increase the concentration of dissolved oxygen, the dissolved oxygen can be removed immediately upstream of substrate treatment device 1, and thus carbonated water in which the dissolved oxygen has been further reduced can be obtained.

Figure 16:
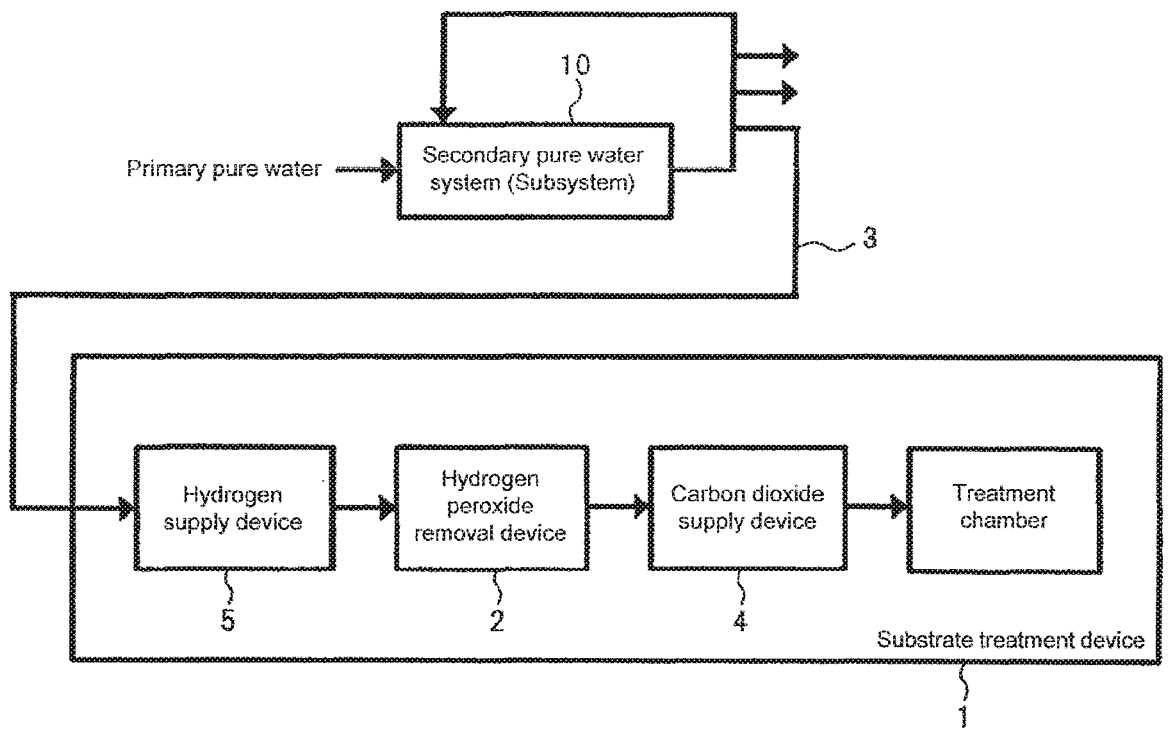
FIG. 16 is a schematic diagram showing an aspect of the substrate treatment method according to the fourth embodiment of the present invention.

FIG. 16 shows another aspect of this embodiment. Since there is a possibility that the oxygen may be dissolved inside the pipe from the pipe, the joint parts or the like as described above, hydrogen peroxide removal device 2 for removing the dissolved oxygen is preferably installed inside substrate treatment device 1. In this case, hydrogen supply device 5 may also be installed inside substrate treatment device 1.

When hydrogen peroxide removal device 2 is installed inside substrate treatment device 1 as described above, installation space is a problem. Therefore, a catalyst column in which a palladium catalyst is supported on a monolithic organic porous anion exchanger is particularly preferably used.

Figure 17:
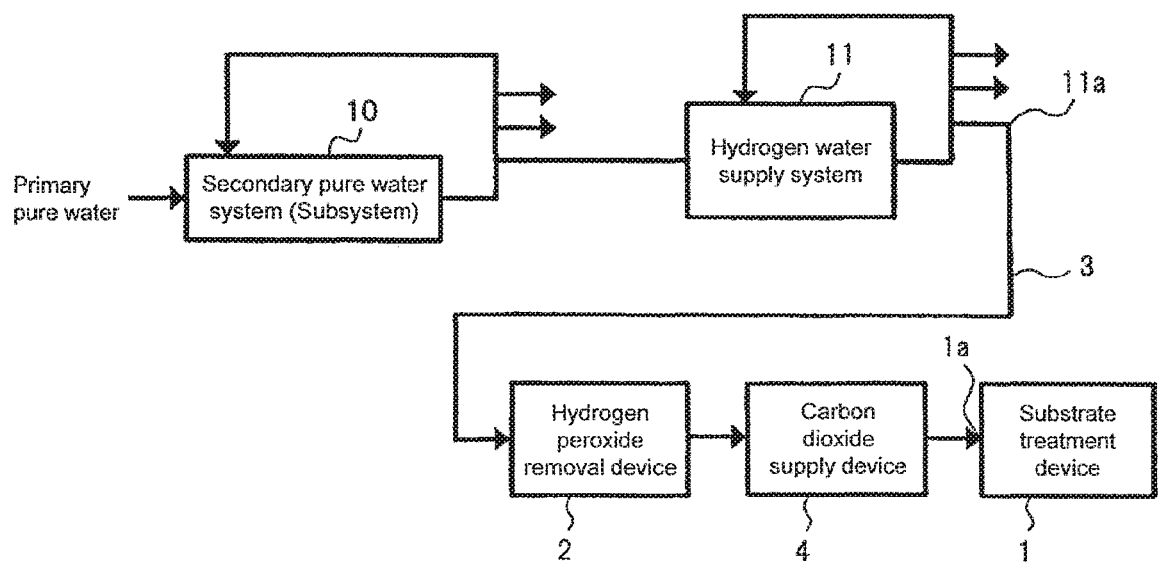
FIG. 17 is a schematic diagram showing an aspect of the substrate treatment method according to the fourth embodiment of the present invention.

FIG. 17 shows yet another aspect of this embodiment. In the aspect shown in FIG. 17, hydrogen water supply system 11 for supplying hydrogen water downstream of subsystem 10 is connected, and hydrogen peroxide removal device 2 and carbon dioxide supply device 4 are installed in this order in a water supply direction between water outlet 11a of the hydrogen water supply system and water inlet 1a of the substrate treatment device. Hydrogen water supply system 11 includes a hydrogen supply device, a water pump, and a hydrogen water tank (not shown), and is configured to return hydrogen water that is not used at substrate treatment device 1. This aspect provides an advantage in which hydrogen peroxide removal device 2 and carbon dioxide supply device 4 can be installed only in substrate treatment device 1 that requires carbonated water in which the concentration of hydrogen peroxide and the concentration of dissolved oxygen have been reduced.

During the substrate cleaning, it is desired that the treatment chamber of substrate treatment device 1 be filled with inactive gas so that the concentration of oxygen gas is 2% or less in the treatment chamber. As the inactive gas, nitrogen gas may be preferably used from an economic standpoint. This is based on the test result shown in Examples described below.

In addition, during the substrate cleaning, it is desired that the treatment chamber of substrate treatment device 1 be shielded from light. This is based on the test result shown in Examples described below.

Fifth Embodiment

Figure 18:
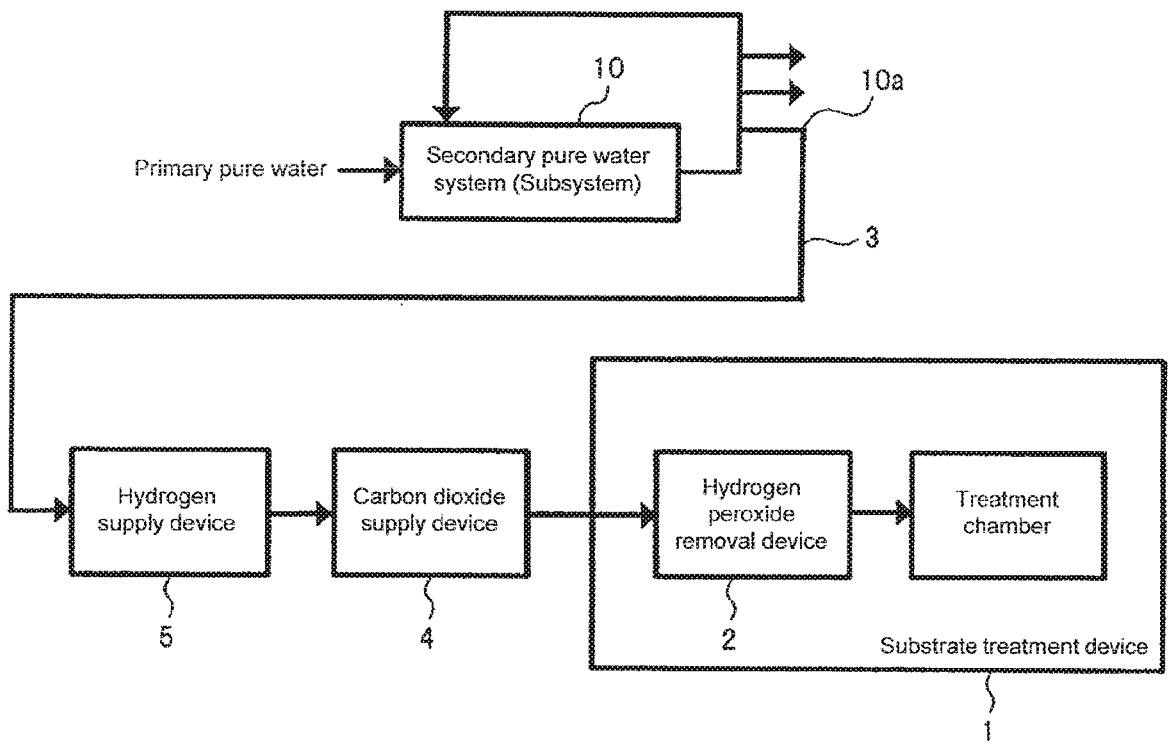
FIG. 18 is a schematic diagram showing an aspect of a substrate treatment method according to a fifth embodiment of the present invention.

FIG. 18 is a schematic diagram showing an aspect of a substrate cleaning method according to the fifth embodiment of the present invention. A subsystem shown in FIG. 18 is the same as any one of the subsystems shown in FIGS. 2 to 4, and components such as an ultraviolet oxidation device, a non-regenerative ion-exchange device, a membrane separation device, and a membrane degasifier are not shown. The water outlet of the subsystem and the water inlet of each substrate treatment device are connected to each other via a main pipe made of PVC, PFA or the like that is mainly used at a semiconductor manufacturing line, A treatment chamber is installed in substrate treatment device 1, and cleaning water is supplied thereto. The number of substrate treatment devices 1 may be one or more, and each substrate treatment device 1 may include one or more treatment chambers. The treatment chamber is provided with a mechanism for holding the substrate. The mechanism may be either a single-wafer type in which carbonated water is sprayed to one substrate in order to treat it or a batch type in which a plurality of substrates are dipped into a tank that stores the carbonated water in order to treat the substrates.

In the aspect shown in FIG. 18, hydrogen supply device 5, carbon dioxide supply device 4, and hydrogen peroxide removal device 2 are installed in this order in a water supply direction between water outlet 10a of the subsystem and the water inlet of the treatment chamber. Alternatively, carbon dioxide supply device 4, hydrogen supply device 5, and hydrogen peroxide removal device 2 may be installed in this order. Further, hydrogen and carbon dioxide may not be supplied by separate supply devices, but may be combined in the pipe to be supplied to raw water. This provides an advantage in which hydrogen supply device 5, carbon dioxide supply device 4, and hydrogen peroxide removal device 2 can be installed only in substrate treatment device 1 that requires carbonated water in which the concentration of hydrogen peroxide and the concentration of dissolved oxygen have been reduced, and thus installation and treatment costs can be reduced. In addition, since hydrogen peroxide removal device 2 is installed on the more downstream side than that in the fourth embodiment, there is an advantage in which a distance from hydrogen peroxide removal device 2 to the treatment chamber is shorter, and dissolution of oxygen from the pipe or joints is prevented.

As in the case of the fourth embodiment, a platinum-group metal catalyst is used for hydrogen peroxide removal device 2. Examples of such a device include a catalyst column filled with a palladium catalyst, and a catalyst column in which a palladium catalyst is supported on a monolithic organic porous anion exchanger can be used. In particular, the catalyst column in which the palladium catalyst is supported on the monolithic organic porous anion exchanger is much smaller than a catalyst column in which a palladium catalyst is supported on a granular ion exchanger, and is thus suitable for the aspect in which the hydrogen peroxide removal device is an accessory to the substrate treatment device. In addition, according to this aspect, carbonic acid-type anion exchanger is preferably used for the monolithic organic porous anion exchanger supporting the palladium catalyst. More detailed specific examples of the platinum-group metal catalyst will be described below.

In this aspect, as shown in FIG. 14, for the purpose of preventing fine particles from flowing out from the platinum-group metal catalyst, a configuration where a filter is disposed downstream of the catalyst column that is filled with the platinum-group metal catalyst is particularly preferably used. As the filter, a microfiltration membrane is particularly preferably used.

In this aspect, as shown in FIG. 18, hydrogen peroxide removal device 2 is particularly preferably installed inside substrate treatment device 1. In addition, carbon dioxide supply device 4 or hydrogen supply device 5, or carbon dioxide supply device 4 and hydrogen supply device 5 may be installed inside substrate treatment device 1, According to the fifth embodiment, carbonated water in which hydrogen peroxide is reduced so that the concentration of hydrogen peroxide is 2 μg/L or less and to which carbon dioxide is added so that the resistivity is adjusted to be within the range of 0.03 MΩ·cm to 5.0 MΩ·cm is supplied to substrate treatment device 1. When this carbonated water is used for cleaning the substrate, the dissolution of copper that is exposed on the substrate surface can be further prevented than the case of using carbonated water in which the concentration of hydrogen peroxide is not limited to 2 μg/L or less.

Further, according to the fifth embodiment, dissolved oxygen can be removed as in the case of the above-mentioned second and fourth embodiments. However, compared with the second and fourth embodiments, hydrogen peroxide removal device 2 is installed near substrate treatment device 1. Accordingly, compared with the second and fourth embodiments, even when oxygen is dissolved inside the pipe extending from the subsystem to the treatment chamber of substrate treatment device 1 from the pipe, from joint parts or from the like to increase the concentration of dissolved oxygen, the dissolved oxygen can be removed immediately upstream of the treatment chamber of substrate treatment device 1, and thus carbonated water in which the dissolved oxygen has been further reduced can be obtained.

Figure 19:
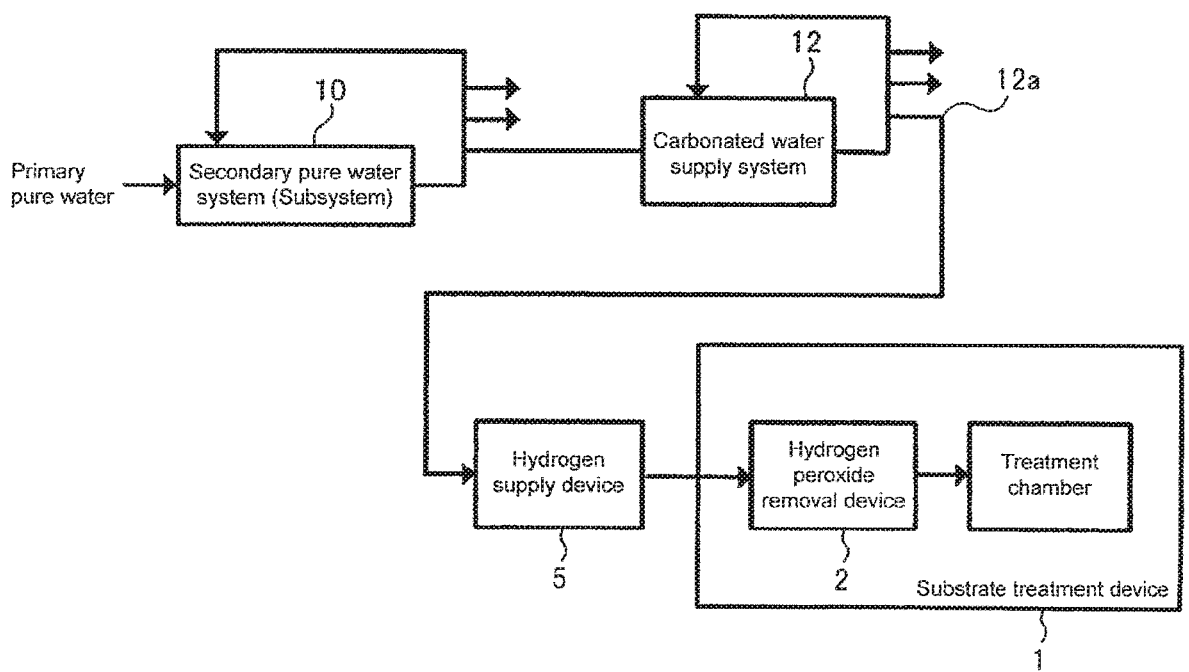
FIG. 19 is a schematic diagram showing an aspect of the substrate treatment method according to the fifth embodiment of the present invention.

FIG. 19 shows another aspect of this embodiment. In the aspect shown in FIG. 19, carbonated water supply system 12 for supplying carbonated water downstream of subsystem 10 is connected, and hydrogen supply device 5 and hydrogen peroxide removal device 2 are installed in this order in a water supply direction between water outlet 12a of the carbonated water supply system and the water inlet of the treatment chamber. Carbonated water supply system 12 includes a carbon dioxide supply device, a water pump, and a carbonated water tank (not shown), and is configured to return carbonated water that is not used at substrate treatment device 1. This aspect provides an advantage in which hydrogen supply device 5 and hydrogen peroxide removal device 2 can be installed only in substrate treatment device 1 that requires carbonated water in which the concentration of hydrogen peroxide and the concentration of dissolved oxygen have been reduced.

Figure 20:
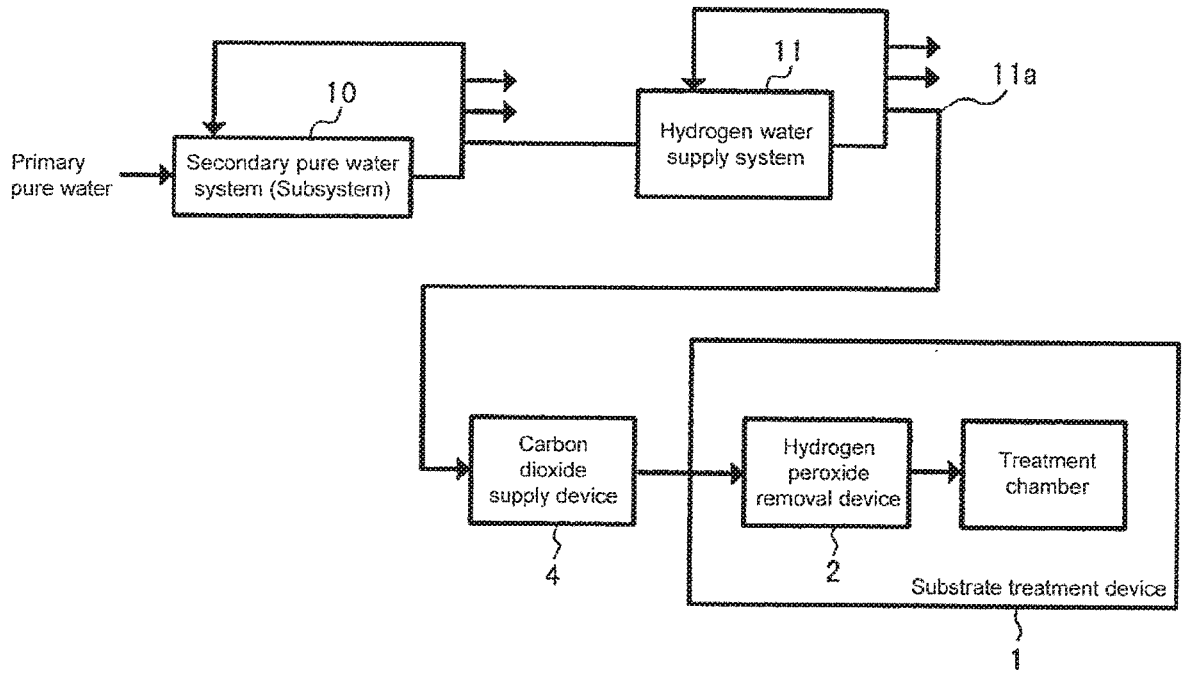
FIG. 20 is a schematic diagram showing an aspect of the substrate treatment method according to the fifth embodiment of the present invention.

FIG. 20 shows yet another aspect of this embodiment. In the aspect shown in FIG. 20, hydrogen water supply system 11 for supplying hydrogen water to subsystem 10 is connected, and carbon dioxide supply device 4 and hydrogen peroxide removal device 2 are installed in this order in a water supply direction between water outlet 11a of the hydrogen water supply system and the water inlet of the treatment chamber. Hydrogen water supply system 11 includes a hydrogen supply device, a water pump, and a hydrogen water tank (not shown), and is configured to return hydrogen water that is not used at substrate treatment device 1. This aspect provides an advantage in which hydrogen peroxide removal device 2 and carbon dioxide supply device 2 can be installed only in the substrate treatment device that requires carbonated water in which the concentration of hydrogen peroxide and the concentration of dissolved oxygen have been reduced.

During the substrate cleaning, it is desired that the treatment chamber of substrate treatment device 1 be filled with inactive gas so that the concentration of oxygen gas is 2% or less in the treatment chamber. As the inactive gas, nitrogen gas may be preferably used from an economic standpoint. This is based on the test result shown in Examples described below.

In addition, during the substrate cleaning, it is desired that the treatment chamber of substrate treatment device 1 be shielded from light. This is based on the test result shown in Examples described below.

[Platinum-Group Metal Catalyst]

The specific examples of a catalyst that is capable of removing hydrogen peroxide and oxygen, which is used for above-mentioned hydrogen peroxide removal device 2, will be described in detail.

<Catalyst Capable of Removing Hydrogen Peroxide and Oxygen>

Such catalysts include a granular ion-exchange resin supporting a platinum-group metal, a metal ion-type granular cation exchange resin, and a non-granular organic porous body supporting a platinum-group metal or a non-granular organic porous ion exchanger supporting a platinum-group metal may be cited.

<Non-Granular Organic Porous Body Supporting Platinum-Group Metal, Non-Granular Organic Porous Ion Exchanger Supporting Platinum-Group Metal>

The non-granular organic porous body supporting the platinum-group metal includes a non-granular organic porous body supporting a platinum-group metal in which platinum-group metal fine particles having an average particle size of 1 to 1000 nm are supported on the non-granular organic porous body that comprises a continuous skeleton phase and a continuous hole phase. In the non-granular organic porous body, the thickness of continuous skeletons is 1 to 100 µm, the average diameter of continuous holes is 1 to 1000 µm, the total pore volume is 0.5 to 50 mL/g, and the amount of supported platinum-group metal is 0.004 to 20% by weight in a dry condition.

The non-granular organic porous ion exchanger supporting the platinum-group metal includes a non-granular organic porous ion exchanger supporting a platinum-group metal in which platinum-group metal fine particles having an average particle size of 1 to 1000 nm are supported on the non-granular organic porous ion exchanger that comprises a continuous skeleton phase and a continuous hole phase. In the non-granular organic porous ion exchanger, the thickness of continuous skeletons is 1 to 100 µm, the average diameter of continuous holes is 1 to 1000 µm, the total pore volume is 0.5 to 50 mL/g, the ion exchange capacity per weight is 1 to 6 mg equivalent weight/g in a dry condition, ion exchange groups are uniformly distributed, and the amount of supported platinum-group metal is 0.004 to 20% by weight in the dry condition.

The average diameter of the opening of the non-granular organic porous body or the non-granular organic porous ion exchanger is measured by a mercury intrusion method, and means the maximum value of a pore distribution curve obtained by the mercury intrusion method. In addition, the structure of the non-granular organic in porous body or the non-granular organic porous ion exchanger, and the thickness of the continuous skeletons are determined by SEM observation. The particle sizes of the nano particles of the platinum-group metal supported on the non-granular organic porous body or the non-granular organic porous ion exchanger are determined by TEM observation.

Since the platinum-group metal having the average particle size of 1 to 1000 nm is supported on the non-granular organic porous body or the non-granular organic porous ion exchanger, the non-granular organic porous body supporting the platinum-group metal or the non-granular organic porous ion exchanger supporting the platinum-group metal exhibits high catalytic activity for hydrogen peroxide decomposition, and allows raw water to pass therethrough at the space velocity (SV) of 200 to 2000 h$^1$, preferably 2000 to 20000 h$^{-1}$.

In the non-granular organic porous body supporting the platinum-group metal, a carrier supporting the platinum-group metal is the non-granular organic porous body. This non-granular organic porous exchanger is a monolithic organic porous exchanger. In the non-granular organic porous ion exchanger supporting the platinum-group metal, a carrier supporting the platinum-group metal is the non-granular organic porous ion exchanger. This non-granular organic porous ion exchanger is a monolithic organic porous ion exchanger in which an ion exchange group is introduced into a monolithic organic porous body.

The monolithic organic porous body has its skeletons made of organic polymers, and includes many communication holes serving as the flow paths of a reaction solution among the skeletons. The monolithic organic porous ion exchanger is a porous body in which ion exchange groups are introduced to be uniformly distributed in the skeletons of the monolithic organic porous body. Herein, the "monolithic organic porous body" and the "monolithic organic porous ion exchanger" are also simply referred to as "monolith" and "monolithic ion exchanger" respectively, and a "monolithic organic porous intermediate body" that is an intermediate body (precursor) in monolith manufacturing is also simply referred to as "monolithic intermediate body".

Structural examples of such a monolith or a monolithic ion exchanger include a continuous bubble structure disclosed in JP 2002-306976 A or JP 2009-62512 A, a bicontinuous structure disclosed in JP 2009-67982 A, a particle aggregation structure disclosed in JP 2009-7550 A, and a particle composite structure disclosed in JP 2009-108294 A, The thickness of the continuous skeletons is 1 to 100 µm in the dry condition of the monolith or the monolithic ion exchanger for the supported platinum-group metal catalyst of the present invention. It is not desirable when the thickness of the continuous skeletons of the monolithic ion exchanger is less than 1 µm, because in addition to the drawback of the reduction of ion exchange capacity per volume, mechanical strength is reduced to greatly deform the monolithic ion exchanger during passage of the solution therethrough at a high flow velocity. Further, such a thickness is not desirable because the contact efficiency of the monolithic ion exchanger with the reaction solution is reduced to lower catalytic activity. On the other hand, it is not desirable when the thickness of the continuous skeletons of the monolithic ion exchanger exceeds 100 because the skeletons become excessively thick which causes an increase in pressure loss during passage of the solution therethrough.

The average diameter of the continuous holes is 1 to 1000 µm in the dry condition of the monolith or the monolithic ion exchanger for the supported platinum-group metal catalyst of the present invention. It is not desirable when the average diameter of the continuous holes of the monolithic ion exchanger is less than 1 µm, because pressure loss increases during passage of the solution therethrough. On the other hand, it is not desirable when the average diameter of the continuous holes of the monolithic ion exchanger exceeds 100 µm, because the contact of the monolithic ion exchanger with the reaction solution is insufficient to lower catalytic activity.

Configuration examples of the above-mentioned monolith, i.e. the monolith serving as a carrier of the platinum-group metal particles, (hereinafter, also referred to as monolith (1)), and the monolithic ion exchanger, i.e. the monolithic ion exchanger serving as a carrier of the platinum-group metal particles, (hereinafter, also referred to as monolithic ion exchanger (1)) include the monolith and the monolithic ion exchanger that have the bicontinuous structures disclosed in JP 2009-67982 A.

Specifically, the monolith (1) is a monolith before any ion exchange group is introduced, wherein the monolith is an organic porous body formed into a bicontinuous structure that includes three-dimensionally continuous skeletons made of aromatic vinyl polymers containing 0.1 to 0.5 mol % of a cross-linked structure unit in all building blocks and having an average thickness of 1 to 60 µm in the dry condition, and that also includes three-dimensionally continuous holes having an average diameter of 10 to 200 µm among the skeletons, and wherein the organic porous body has a total pore volume set to 0.5 to 10 mL/g in the dry condition.

The monolithic ion exchanger (1) is a monolithic ion exchanger formed into a bicontinuous structure that includes three-dimensionally continuous skeletons made of aromatic vinyl polymers containing 0.1 to 0.5 mol % of a cross-linked structure unit in all building blocks and having an average thickness of 1 to 60 µm in the dry condition, and that also includes three-dimensionally continuous holes having an average diameter of 10 to 200 μm among the skeletons, wherein the monolithic ion exchanger has a total pore volume set to 0.5 to 10 mL/g in the dry condition, has ion exchange groups that are uniformly distributed in the organic porous ion exchanger, and has an ion exchange capacity per weight set to 1 to 6 mg equivalent weight/g in the dry condition.

The monolith (1) or the monolithic ion exchanger (1) is formed into the bicontinuous structure that includes the three-dimensionally continuous skeletons having the average thickness of 1 to 60 μm, preferably 3 to 58 μm, in the dry condition, and that also includes the three-dimensionally continuous holes having the average diameter of 10 to 200 μm, preferably 15 to 180 μm, particularly preferably 20 to 150 μm, in the dry condition among the skeletons. The bicontinuous structure is a structure in which the continuous skeleton phase and the continuous hole phase are three-dimensionally continuous. The continuous holes have high continuity and are not so different in size, compared with the conventional continuous bubble-type monolith or the conventional particle aggregation-type monolith. Since the skeletons are thick, mechanical strength is high.

The average diameter of the opening of the monolith (1), the average diameter of the opening of the monolithic ion exchanger (1), and the average diameter of the opening of the monolithic intermediate body (1) of the dry condition obtained by a I process in monolith manufacturing described below are measured by the mercury intrusion method, and mean the maximum values of pore distribution curves obtained by the mercury intrusion method. In addition, the average thickness of the skeletons of the monolith (1) or the monolithic ion exchanger (1) in the dry condition is determined by the SEM observation of the monolith (1) or the monolithic ion exchanger (1). Specifically, the SEM observation is carried out at least three times for the monolith (1) or the monolithic ion exchanger (1) in the dry condition, the thicknesses of skeletons in an obtained image are measured, and the average value thereof is set as the average thickness. The skeleton is bar-shaped, and has a circular section. However, some skeletons may have different-diameter sections such as elliptic sections. In this case, a thickness is an average of short and long diameters.

The total pore volume per weight of the monolith (1) or the monolithic ion exchanger (1) in the dry condition is 0.5 to 50 mL/g. It is not desirable when the total pore volume is less than 0.5 mL/g, because pressure loss increases during passage of the solution therethrough. Further, such a total pore volume is not desirable because the transmission amount per unit sectional area is reduced to lower the treatment amount. It is not desirable when the total pore volume exceeds 10 mL/g, because mechanical strength is reduced to greatly deform the monolith or the monolithic ion exchanger during passage of the solution therethrough at a high flow velocity. Further, such a total pore volume is not desirable because the contact efficiency of the monolith or the monolithic ion exchanger with the reaction solution is reduced to lower catalytic activity. When the sizes of the three-dimensionally continuous holes and the total power volume are within the above-mentioned ranges, the contact with the reaction solution is extremely uniform, the contact area is large, and passage of the solution can be carried out with low pressure loss.

In the monolith (1) or the monolithic ion exchanger (1), the material of the skeleton is an aromatic vinyl polymer containing 0.1 to 0.5 mol %, preferably 0.5 to 3.0 mol %, of a cross-linked structure unit in all building blocks, and hydrophobic. It is not desirable when the cross-linked structure unit is less than 0.1 mol %, because mechanical strength is short. When the cross-linked structure unit exceeds 5 mol %, the structure of the porous body easily deviates from the bicontinuous structure. Types of aromatic vinyl polymers include, but not limited to, polystyrene, poly (<-methyl styrene), polyvinyl toluene, polyvinyl benzyl chloride, polyvinyl biphenyl, polyvinyl naphthalene, and the like. The above-mentioned polymer may be a polymer obtained by copolymerizing a single vinyl monomer with a cross-linking agent, a polymer obtained by polymerizing a plurality of vinyl monomers with a cross-linking agent, or a polymer obtained by blending two types of polymers. Among these organic polymer materials, a styrene divinyl benzene copolymer or a vinyl benzyl chloride divinyl benzene is preferable in view of the easy formation of the bicontinuous structure, the easy introduction of the ion exchange groups and the high mechanical strength, and stability with respect to acid or alkali.

In the monolithic ion exchanger (1), the introduced ion exchange groups are uniformly distributed not only on the surface of the monolith but also in the skeletons of the monolith. The description "ion exchange groups are uniformly distributed" means that the ion exchange groups are uniformly distributed on the surface and in the skeletons by at least a μm order. The distribution state of the ion exchange groups can be easily confirmed by using EPMA. In addition, when the ion exchange groups are uniformly distributed not only on the surface of the monolith but also in the skeletons of the monolith, physical properties and chemical properties on the surface and in the inside can be made uniform, improving resistance to swelling and shrinkage.

The ion exchange groups introduced into the monolithic ion exchanger (1) are cation exchange groups or anion exchange groups. The cation exchange groups include a carboxylic acid group, an iminodiacetic acid group, a phosphoric group, a phosphoester group, and the like. The anion exchange groups include a quaternary ammonium group such as a tri-methyl ammonium group, a tri-ethyl ammonium group, a tri-butyl ammonium group, a dimethyl hydroxy ethyl ammonium group, a dimethyl hydroxy propyl ammonium group, or a methyl dihydroxy ethyl ammonium group, a tertiary sulfonium group, a phosphonium group, and the like.

The monolithic ion exchanger (1) has an ion exchange capacity per weight in the dry condition set to 1 to 6 mg equivalent weight/g. In the monolithic ion exchanger (1), the continuity and uniformity of the three-dimensionally continuous holes is high, and thus pressure loss does not increase much even when the total pore volume is reduced. Accordingly, the ion exchange capacity per volume can be increased dramatically while pressure loss is maintained low. By setting the ion exchange capacity per weight within the above-mentioned range, the environment around a catalytic active site, such as pH in the catalyst, can be changed, which causes catalytic activity to increase. When the monolithic ion exchanger (1) is a monolithic anion exchanger, anion exchange groups are introduced into the monolithic anion exchanger (1), and the anion exchange capacity per weight in the dry condition is 1 to 6 mg equivalent weight/g. When the monolithic ion exchanger (1) is a monolithic cation exchanger, cation exchange groups are introduced into the monolithic cation exchanger (1), and the cation exchange capacity per weight in the dry condition is 1 to 6 mg equivalent weight/g.

The monolith (1) is obtained by implementing the manufacturing method of the monolithic organic porous body disclosed in JP 2009-67982 A. Specifically, the method includes:

a I process for stirring the mixture of an oil-soluble monomer that does not contain an ion exchange group, a surface active agent, and water to prepare water-in-oil emulsion, and then polymerizing the water-in-oil emulsion to obtain a monolithic organic porous intermediate body (hereinafter, also referred to as monolithic intermediate body (1)) of a continuous micropore structure in which the total pore volume is larger than 16 mL/g and is equal to or less than 30 mL/g;

a II process for preparing a mixture including an aromatic vinyl monomer, 0.3 to 5 mol % of a cross-linking agent among all oil-soluble monomers having at least two or more vinyl groups in one molecule, an organic solvent in which the aromatic vinyl monomer and the cross-linking agent are dissolved while a polymer prepared by polymerizing the aromatic vinyl monomer is not dissolved, and a polymerization initiator; and a III process for obtaining a monolith (1) that is the organic porous body of a bicontinuous structure by conducting polymerization under the stationary state of the mixture obtained in the II process and in the presence of the monolithic intermediate body (1) obtained in the I process.

The platinum-group metal is supported on the non-granular organic porous body supporting the platinum-group metal or the non-granular organic porous ion exchanger supporting the platinum-group metal. Such platinum-group metals are ruthenium, rhodium, palladium, osmium, iridium, and platinum. These platinum-group metals can be used singly, or two or more types of metals can be used in combination. Further, two or more type of metals can be used as an alloy. Among these metals, platinum, palladium, and the platinum-palladium alloy are preferable because of high catalytic activity.

The average particle size of the platinum-group metal fine particles supported on the non-granular organic porous body supporting the platinum-group metal or the non-granular organic porous ion exchanger supporting the platinum-group metal is 1 to 1000 nm, preferably 1 to 200 nm, and more preferably 1 to 20 nm. It is not desirable when the average particle size is less than 1 nm, because the possibility of the separation of the platinum-group metal fine particles from the carrier is higher. It is not desirable when the average particle size exceeds 200 nm, because the surface area of the metal per unit mass is reduced which makes it hard to achieve the catalyst effect efficiently. The average particle size of the platinum-group metal fine particles is determined by analyzing a TEM image obtained through transmission electron microscope (TEM) analysis.

The amount of supported platinum-group metal fine particles in the non-granular organic porous body supporting the platinum-group metal or the non-granular organic porous ion exchanger supporting the platinum-group metal ((platinum-group metal fine particles/the supported platinum-group metal catalyst of dry condition)·100) is 0.004 to 20% by weight, and preferably 0.005 to 15% by weight. It is not desirable when the amount of supported platinum-group metal fine particles is less than 0.004% by weight, because catalytic activity is insufficient. It is not desirable when the amount of supported platinum-group metal fine particles exceeds 20% by weight, because metal elution into the water is manifested.

The manufacturing method of the non-granular organic porous body supporting the platinum-group metal or the non-granular organic porous ion exchanger supporting the platinum-group metal is not limited to any particular method. By a known method, the supported platinum-group metal catalyst can be obtained by supporting the fine particles of the platinum-group metal on the monolith or the monolithic ion exchanger. An example of the method for supporting the platinum-group metal on the non-granular organic porous body or the non-granular organic porous ion exchanger includes a method disclosed in JP 2010-240641 A. This is a method for, for example, dipping the monolithic ion exchanger of the dry condition in the methanol solution of a platinum-group metal compound such as palladium acetate, adsorbing palladium ions on the monolithic ion exchanger by ion exchanging, and then bringing the palladium ions in contact with a reducing agent to support palladium metal fine particles on the monolithic ion exchanger. Alternatively, this is a method for dipping the monolithic ion exchanger in the aqueous solution of a platinum-group metal compound such as tetra amine palladium complex, adsorbing palladium ions on the monolithic ion exchanger by ion exchanging, and then bringing the palladium ions in contact with a reducing agent to support palladium metal fine particles on the monolithic ion exchanger.

A granular ion-exchange resin supporting a platinum-group metal is obtained by supporting a platinum-group metal on a granular ion-exchange resin. Examples of the granular ion-exchange resin serving as a carrier of the platinum-group metal include, but not limited to, a strongly basic anion exchange resin and the like. The platinum-group metal is supported on the granular ion-exchange resin by a known method to obtain the granular ion-exchange resin supporting the platinum-group metal.

A metal ion-type granular cation exchange resin supporting a metal is obtained by supporting a metal such as iron ions, copper ions, nickel ions, chrome ions, or cobalt ions on a granular cation exchange resin. Examples of the granular cation exchange resin serving as a carrier include, but not limited to, a strongly acidic cation exchange resin and the like. The metal such as iron ions, copper ions, nickel ions, chrome ions, or cobalt ions is supported on the granular cation exchange resin by a known method to obtain the metal ion-type granular cation exchange resin supporting the metal.

Hereinafter, the catalyst of catalyst unit 21 used in the present invention will be specifically described. However, this is only an example, and is not limitative of the present invention.

<Manufacturing of Non-Granular Organic Porous Ion Exchanger Supporting Platinum-Group Metal>

(Manufacturing of Monolithic Intermediate Body (I Process))

9.98 g of styrene, 0.19 g of divinyl benzene, 0.50 g of sorbitan monooleate (hereinafter, abbreviated to SMO), and 0.25 g of 2,2'-azobis(isobutyronitrile) were mixed to be uniformly dissolved. Then, the mixture of the styrene/divinyl benzene/SMO/2,2'-azobis(isobutyronitrile) was added to 180 g of pure water, and stirred under reduced pressure by using a vacuum stirring and defoaming mixer (from EME Inc.) that was a planetary stirring device to obtain a water-in oil emulsion. This emulsion was quickly moved into a reaction container, and sealed and polymerized in a stationary state at 60° C. for 24 hours. After polymerization, the contents were taken out, extracted by methanol, and then dried under reduced pressure to manufacture a monolithic intermediate body having a continuous macropore structure. The internal structure of the monolithic intermediate body (dried body) thus obtained was observed by SEM. According to the SEM image, although a wall part defining two adjacent macropores was extremely thin and bar-shaped, it had a continuous bubble structure, the average diameter of the openings (mesopores) at the overlapped part of the macropores measured by the mercury intrusion method was 40 μm, and the total pore volume was 18.2 mL/g.

(Manufacturing of Monolith)

Then, 216.6 g of styrene, 4.4 g of divinyl benzene, 220 g of 1-decanol, and 0.8 g of 2,2'-azobis (2,4-dimetyl valeronitrile) were mixed to be uniformly dissolved (II process). Then, the above-mentioned monolithic intermediate body was placed into the reaction container, and dipped in the mixture of the styrene/divinyl benzene/1-decanol/2,2'-azobis(2,4-dimetyl valeronitrile), and defoamed in a pressure reduced chamber, and then the reaction container was sealed to polymerize the mixture in a stationary state at 50° C. for 24 hours. After the end of polymerization, the contents were taken out, soxhlet-extracted by acetone, and then dried under reduced pressure (Ill process)

The internal structure of the monolith (dried body) thus obtained and containing 1.2 mol % of a cross-linking component including a styrene/divinyl benzene copolymer was observed by SEM. According to the SEM observation, the monolith had a bicontinuous structure in which skeletons and holes were respectively three-dimensionally continuous and both phases were combined. The average thickness of the skeletons measured from the SEM image was 20 μm. In addition, the average diameter of the three-dimensionally continuous holes of the monolith measured by the mercury intrusion method was 70 μm, and the total pore volume was 4.4 mL/g. The average diameter of the holes was determined as the maximum value of a pore distribution curve obtained by the mercury intrusion method.

(Manufacturing of Monolithic Anion Exchange)

The monolith manufactured by the above-mentioned method was placed in a column reaction container, a solution containing 1600 g of chlorosulfonic acid, 400 g of tin tetrachloride, and 2500 mL of dimethoxymethane was circulated and passed therethrough, and reaction was carried out at 30° C. for 5 hours to introduce a chloromethyl group. After the end of the reaction, the chloromethyl monolith was cleaned with the mixed solvent of THF/water=2/1, and further cleaned with THF. 1600 mL of THE and 1400 mL of a trimethyl amine 20% aqueous solution were added to this chloromethyl monolith, and reaction was carried out at 60° C. for 6 hours. After the end of the reaction, the product was cleaned with methanol, and then cleaned with pure water to obtain a monolithic anion exchanger.

The anion exchange capacity of the obtained monolithic anion exchanger was 4.2 mg equivalent weight/g in the dry condition, and it was confirmed that a quaternary ammonium group was quantitatively introduced. The thickness of the skeletons measured from a SEM image was 20 μm in the dry condition, and the average diameter of the three-dimensionally continuous holes of the monolithic anion exchanger measured by the mercury intrusion method was 70 μm in the dry condition, and the total pore volume was 4.4 mL/g in the dry condition.

Then, to check the distribution state of the quaternary ammonium group in the monolithic anion exchanger, the monolithic anion exchanger was treated with a hydrochloric solution to be a chloride type, and then the distribution state of chloride ions was observed by EPMA. As a result, it was confirmed that the chloride ions were uniformly distributed not only on the skeleton surface of the monolithic anion exchanger but also in the skeletons, and quaternary ammonium groups were uniformly introduced into the monolithic anion exchanger.

(Supporting of Platinum-Group Metal)

The above-mentioned monolithic anion exchanger was ion-exchanged into the Cl type, and then cut out in a cylindrical shape in the dry condition to be dried under reduced pressure. The weight of the dried monolithic anion exchanger was 2.1 g. This monolithic anion exchanger of the dry condition was dipped in diluted hydrochloric acid in which 160 mg of palladium chloride was dissolved for 24 hours to be ion-exchanged into a palladium chloride acid type. After the end of the dipping, the monolithic anion exchanger was cleaned with pure water several times, and dipped in an aqueous hydrazine for 24 hours to be subjected to reduction treatment. While the palladium chloride acid-type monolithic anion exchanger was brown, the monolithic anion exchanger after the reduction treatment was colored black, indicating the production of palladium fine particles. The sample after the reduction was cleaned with pure water several times, and then dried under reduced pressure. The column of an inner diameter of 57 mm was filled with the obtained supported palladium-fine-particle catalyst, of the dry condition with a layer height of 40 mm, and an aqueous sodium hydroxide was passed therethrough to form the monolithic anion exchanger as a carrier into an OH type. On the other hand, in order to form an ion type into a carbonic acid type, an aqueous ammonium hydrogen carbonate was passed through the column.

When the amount of supported palladium was obtained by ICP emission spectroscopy, the amount of supported palladium was 3.9% by weight. In order to check the distribution state of the palladium supported on the monolithic anion exchanger, the distribution state of the palladium was observed by EPMA. It was confirmed that the palladiums were uniformly distributed not only on the skeleton surface of the monolithic anion exchanger but also in the skeletons, and distributed relatively uniformly while the concentration was slightly higher inside. In addition, to measure the average particle size of supported palladium particles, observation was carried out by a transmission electron microscope (TEM). The average particle size of supported palladium fine particles was 8 nm.

EXAMPLES

Hereinafter, measurement results obtained by treating a substrate with carbonated water produced by h method of the present invention will be described.

[Test Method]

As a substrate (sample) to be cleaned and treated, a wafer having a copper thin film that was cut into 24 mm square was used. The wafer having the copper thin film was prepared by depositing 50 nm of titanium as a base (support layer) on a silicon wafer by sputtering beforehand, and then depositing 200 nm of copper by sputtering.

As a substrate treatment device, a single wafer cleaning device made by ZENKYO CORPORATION was used.

The above-mentioned 24 mm-square sample was set on the center of the substrate holding table of the device, and the sample was cleaned with carbonated water for a predetermined period of time while rotated at 500 rpm. As carbonated water to be evaluated, carbonated water was prepared by using ultrapure water described below as raw water, and by adjusting the water to the qualities of various test examples below. To remove hydrogen peroxide, a catalyst column in which a palladium catalyst is supported on a monolithic organic porous anion exchanger was used. The synthesis method of the catalyst was as described above.

Sheet resistance measurement was carried out by using a four-point probe measurement device Model Σ-5+ made by NPS, Inc. Increasing the sheet resistance by treatment means reducing the thickness of the copper thin film, or nonconductor formation on the copper thin film, and both cases are caused by copper corrosion.

A measurement device Model 510 made by Hack Company was used for a dissolved oxygen concentration meter, a measurement device Model DHDI-I made by DKK-TOA CORPORATION was used for a dissolved hydrogen concentration meter, and a measurement device Model MH-7 made by ORGANO CORPORATION was used for measuring resistivity. A phenolphthalin method was used for measuring hydrogen peroxide concentration.

[Raw Water (Ultrapure Water)]

Used ultrapure water was the secondary pure water of an ultrapure water production device installed in R&D center of ORGANO CORPORATION. Water quality at the outlet of the ultrapure water production device is as shown in Table 1 below.

TABLE 1

| Measurement item | Measured value |
| --- | --- |
| Resistivity | 18.2 MΩ · cm |
| Total organic carbon concentration | 1 μg/L or less |
| Number of fine particles | 1/mL or less (particle size of 0.05 μm or more) |
| Number of viable bacteria | 0.1/L or less |
| Silica | 0.1 μgSiO$_2$/L or less |
| Sodium | 5 ng/L or less |
| Iron | 5 ng/L or less |
| Copper | 5 ng/L or less |
| Chloride ion | 5 ng/L or less |
| Oxidation-reduction potential | +300 mV (vs. NHE) |
| Dissolved oxygen concentration | 2 μg/L or less |
| Hydrogen peroxide concentration | 15 μg/L or less |
| Water temperature | 23° C. |

Example 1

Figure 21:
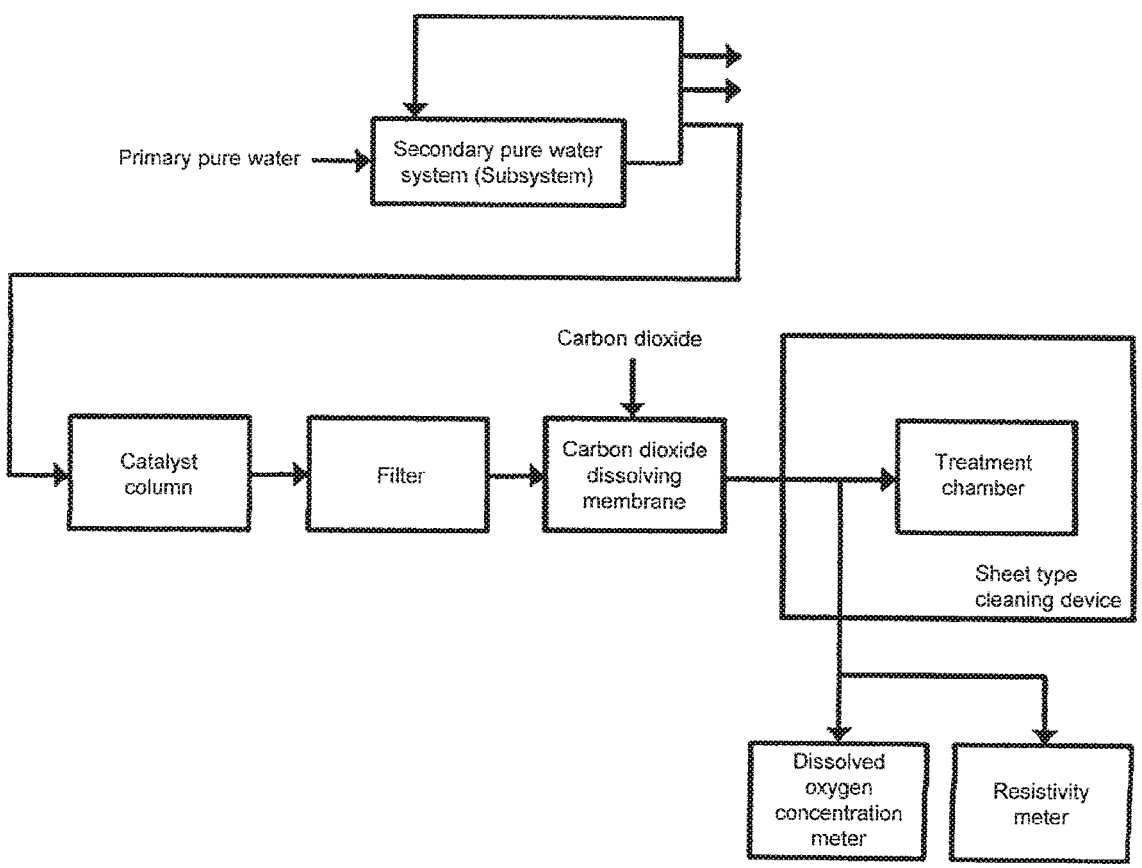
FIG. 21 is a schematic diagram showing an aspect of a test line according to Example 1.

This test was carried out by using a test line shown in FIG. 21. The secondary pure water (ultrapure water) of the ultrapure water production device was passed through a catalyst column to remove hydrogen peroxide, and passed through a filter (microfiltration membrane), and then carbon dioxide was dissolved by using a carbon dioxide dissolving membrane to set resistivity to 0.1 MΩ·cm. Carbonated water thus produced was introduced into the treatment chamber in the single wafer cleaning device to clean the sample for 2 hours. Table 2 shows the value per hour of the increase of the sheet resistance measured value after cleaning with respect to the sheet resistance measured value before the cleaning. The concentration of hydrogen peroxide included in treatment water in this case was 2 μg/L or less. When a part of the treatment water was extracted immediately upstream of the treatment chamber in the single wafer cleaning device to measure the concentration of dissolved oxygen, it was 30 μg/L. It is inferred that while the concentration of dissolved oxygen at the outlet of the ultrapure water production device was 2 μg/L or less as shown in Table 1, the concentration of dissolved oxygen immediately upstream of the treatment chamber increased to 30 μg/L due to the dissolution of air through PFA pipe, joint members or the like, Comparative Example 1

This test was carried out by bypassing the catalyst column and the filter of the test line shown in FIG. 21. Carbon dioxide was dissolved in the secondary pure water (ultrapure water) of the ultrapure water production device by using a carbon dioxide dissolving membrane to set resistivity to 0.1 MΩ·cm. Carbonated water thus produced was introduced into the treatment chamber in the single wafer cleaning device to clean the sample for 2 hours. Table 2 shows the value per hour of the increase of the sheet resistance measured value after cleaning with respect to the sheet resistance measured value before the cleaning. The concentration of hydrogen peroxide included in treatment water in this case was 15 μg/L, and the concentration of dissolved oxygen immediately upstream of the treatment chamber was 30 μg/L.

TABLE 2

| | Hydrogen peroxide concentration μg/L | Sheet resistance increase mΩ/sq./h |
| --- | --- | --- |
| Example 1 | <2 | 0.8 |
| Comparative Example 1 | 15 | 2.6 |

From Table 2, it is clear that even in the presence of 30 μg/L of dissolved oxygen, when the carbonated water in which the concentration of hydrogen peroxide has been reduced to 2 μg/L or less, is used for cleaning, the increase in sheet resistance was smaller than the case where no hydrogen peroxide was removed, in other words, copper corrosion was prevented.

Figures 1A, 22:
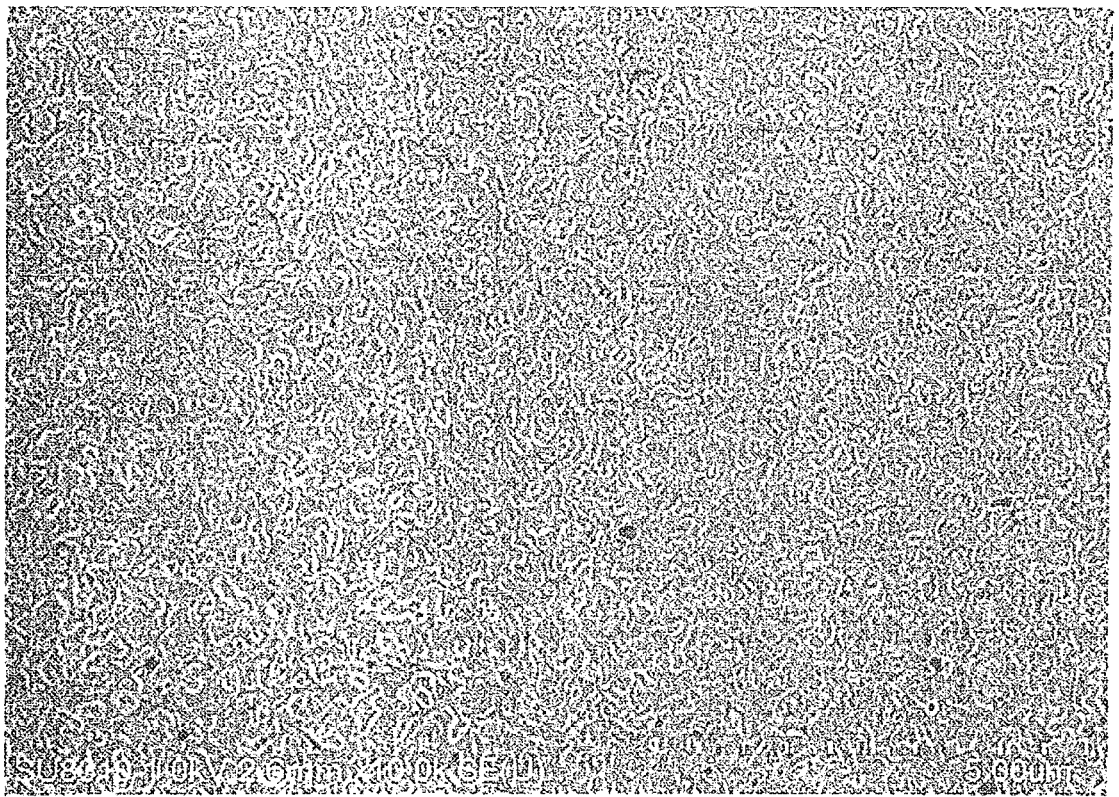
FIG. 22-1*a* is the SEM image of a sample subjected to 16-hour cleaning according to Example 1 (less than hydrogen peroxide concentration 2 μg/L)
Figures 1B, 22:
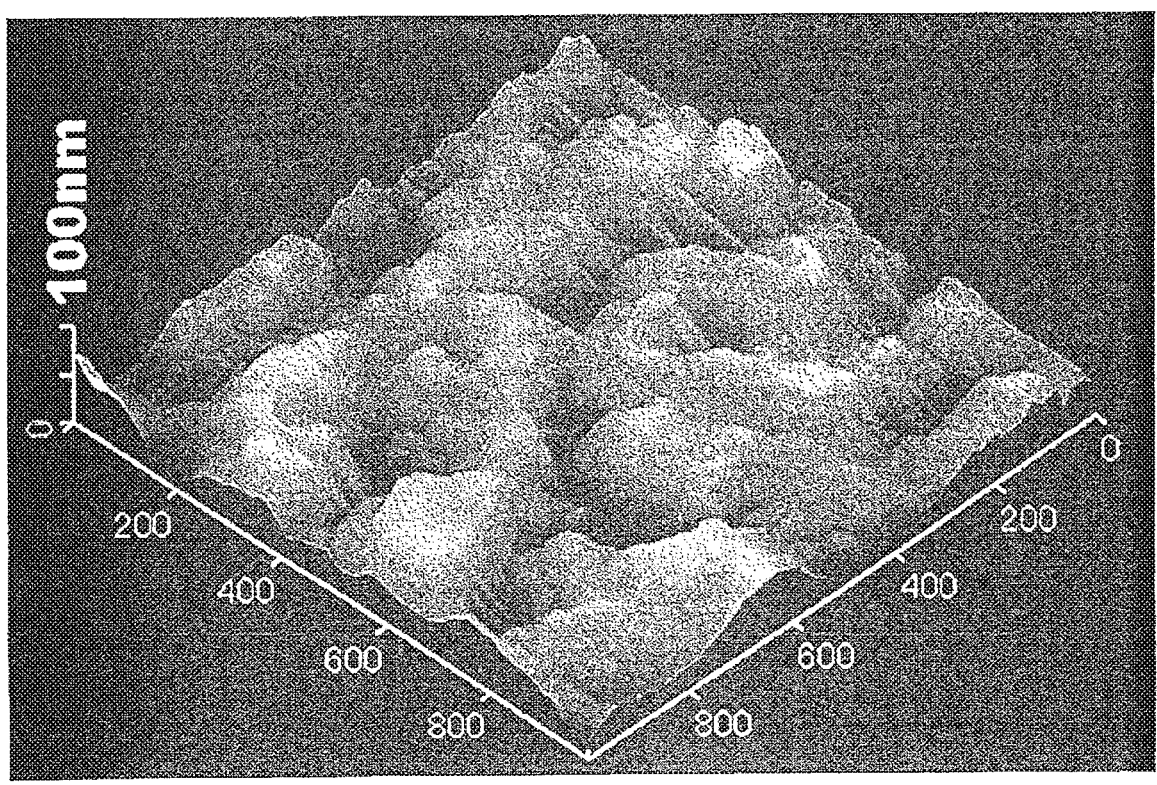
Figures 2A, 22:
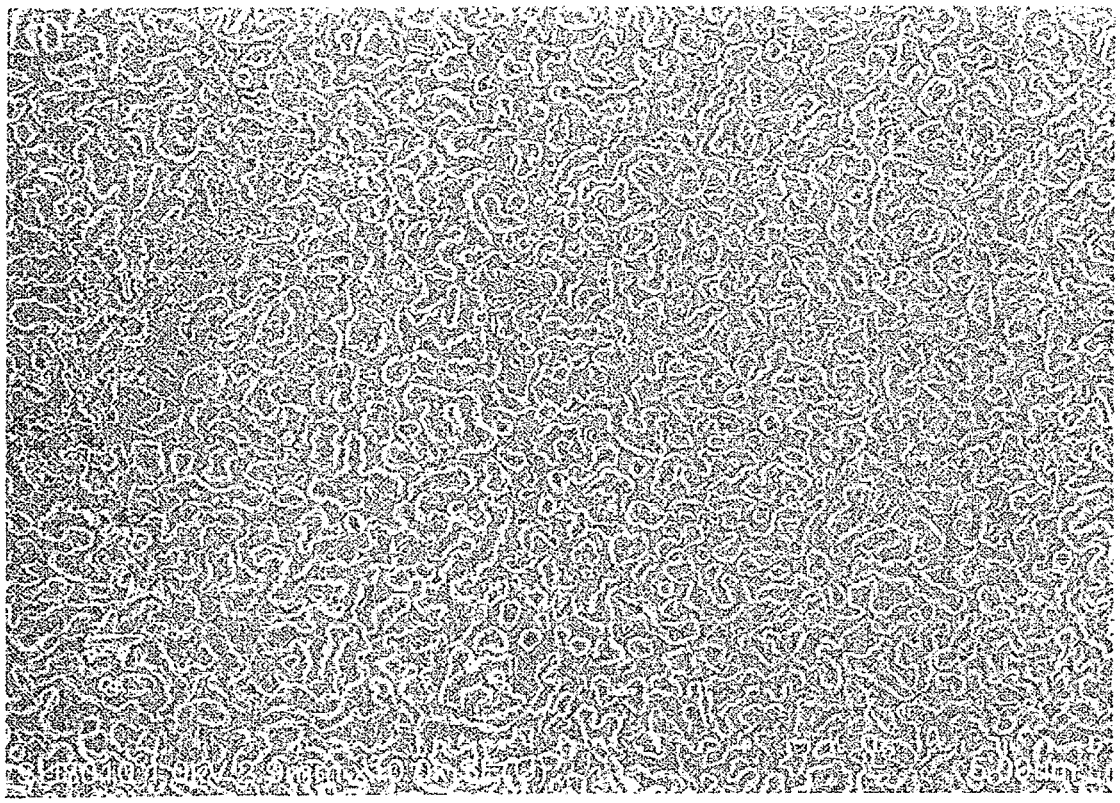
Figures 2B, 22:
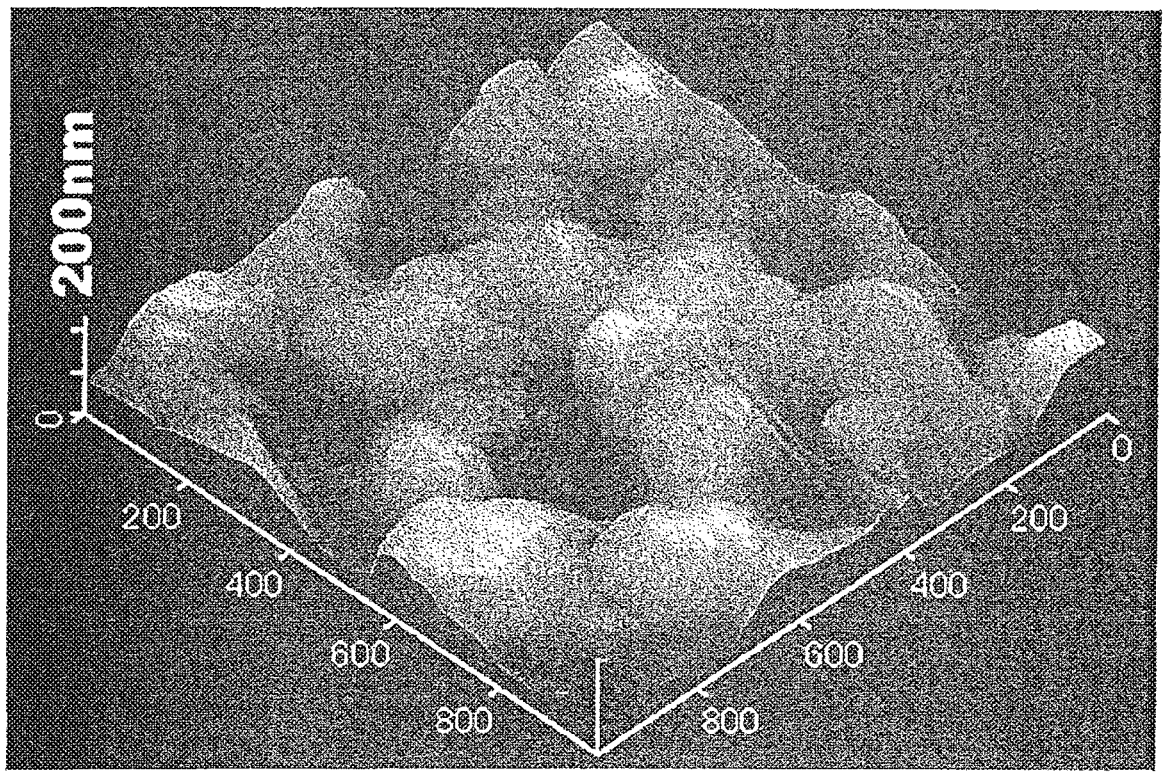

FIGS. 22-1a and 22-1b show images obtained by carrying out SEM (scanning electron microscope) observation and SPM (scanning probe microscope) observation for a sample subjected to 16-hour cleaning under the same condition as that of Example 1, respectively, and FIGS. 22-2a and 22-2b show images obtained by carrying out the SEM observation and the SPM observation for a sample subjected to 16-hour cleaning under the same condition as that of Comparative Example 1, respectively. When these figures are compared, it can be understood that in the case when the carbonated water in which the concentration of hydrogen peroxide has been reduced to 2 μg/L or less (Example 1), is used for cleaning, the sizes of pitting corrosion (places surrounded with many white wave lines shown) are small and shallow, and in other words, the progress of pitting corrosion is prevented.

Example 2

Figure 23:
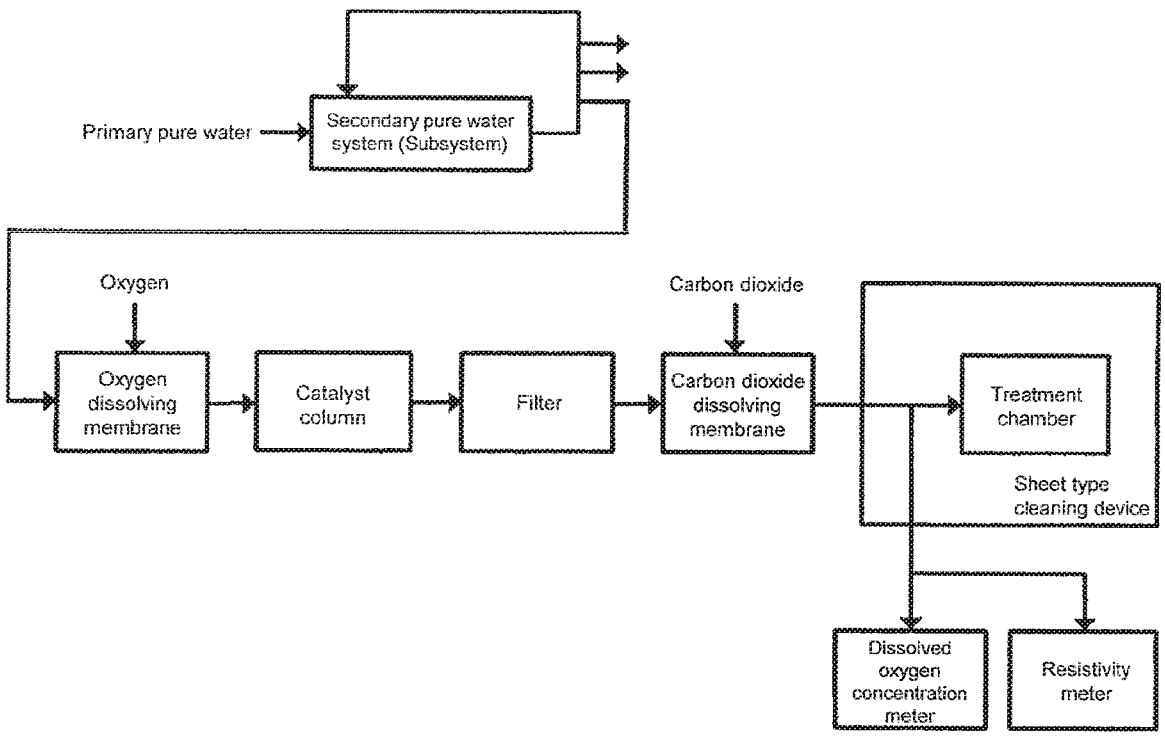
FIG. 23 is a schematic diagram showing an aspect of a test line according to Example 2.

This test was carried out by using a test line shown in FIG. 23. The predetermined concentration of oxygen gas was dissolved in the secondary pure water (ultrapure water) of the ultrapure water production device by using an oxygen dissolving membrane, then the water in which this oxygen was dissolved was passed through a catalyst column to remove hydrogen peroxide, and passed through a filter (microfiltration membrane); and then carbon dioxide was dissolved by using a carbon dioxide dissolving membrane to set resistivity to 0.1 MΩ·cm. Carbonated water thus produced was introduced into the treatment chamber in the single wafer cleaning device to clean the sample for 2 hours. Table 3 shows the value per hour of the increase of the sheet resistance measured value after cleaning with respect to the sheet resistance measured value before the cleaning. The concentration of hydrogen peroxide included in treatment water in this case was 2 μg/L or less. The concentration of dissolved oxygen was measured by extracting a part of the treatment water immediately upstream of the treatment chamber in the single wafer cleaning device.

As described above, it is thought that due to the dissolution of air through the pipe or the joints from the secondary pure water of the ultrapure water production device to the substrate treatment device (single wafer cleaning device in this test), a substantial amount of oxygen was dissolved at an actual cleaning position. This test was conducted by changing the concentration of dissolved oxygen in view of the above-mentioned situation.

Comparative Example 2

This test was carried out by bypassing the catalyst column and the filter of the test line shown in FIG. 23. Carbon dioxide was dissolved in the secondary pure water (ultrapure water) of the ultrapure water production device by using a carbon dioxide dissolving membrane to set resistivity to 0.1 MΩ·cm. Carbonated water thus produced was introduced into the treatment chamber in the single wafer cleaning device to clean the sample for 2 hours. Table 3 shows the value per hour of the increase of the sheet resistance measured value after cleaning with respect to the sheet resistance measured value before the cleaning. The concentration of hydrogen peroxide included in treatment water in this case was 15 μg/L, and the concentration of dissolved oxygen was measured by extracting a part of the treatment water immediately upstream of the treatment chamber.

TABLE 3

| | Dissolved oxygen concentration μg/L | Hydrogen peroxide concentration μg/L | Sheet resistance increase mΩ/sq./h |
|---|---|---|---|
| Example 2-1 | 130 | <2 | 0.9 |
| Comparative Example 2-1 | 130 | 15 | 3.4 |
| Example 2-2 | 800 | <2 | 13.2 |
| Comparative Example 2-2 | 800 | 15 | 20.5 |

As can be understood from Table 3, due to the increase of the concentration of dissolved oxygen, the increase in sheet resistance is greater than those of Example 1 and Comparative Example 1. It has been thought that, as the concentration of dissolved oxygen in the carbonated water was higher, the copper dissolved more easily. This was verified by the test result. When Example 2-1 is compared with Comparative Example 2-1 and Example 2-2 is compared with Comparative Example 2-2, it is clear that even in the presence of the certain amounts of such dissolved oxygen (130 μg/L and 800 μg/L), when the carbonated water in which the concentration of hydrogen peroxide has been reduced to 2 μg/L or less, is used for cleaning, the increase in sheet resistance is smaller than a case where no hydrogen peroxide is removed, in other words, copper corrosion is prevented.

Further, from the results of Table 2 and Table 3, it is clear that in the case where the carbonated water in which the concentration of dissolved oxygen immediately upstream of the treatment chamber in the single wafer cleaning device has been reduced to 130 μg/L or less and in which the concentration of hydrogen has been reduced to 2 μg/L or less, the increase in sheet resistance is smaller, in other words, copper corrosion is prevented.

Example 3

In the test of Example 1, a test was carried out by implementing light shielding in the treatment chamber. Table 4 shows a result.

TABLE 4

| | Hydrogen peroxide concentration μg/L | Light shielding | Sheet resistance increase mΩ/sq./h |
|---|---|---|---|
| Example 1 | <2 | No | 0.8 |
| Example 3 | <2 | Yes | 0.6 |

As can be seen from Table 4, it is clear that corrosion can be prevented by cleaning the substrate with the carbonated water in which the concentration of hydrogen has been reduced to 2 μg/L or less and under the light shielding condition in the treatment chamber.

Example 4

In the test of Example 1, a cleaning test was carried out by introducing nitrogen gas into the treatment chamber and under the condition in which the concentration of oxygen gas was reduced to 2% or less. Table 5 shows the result.

TABLE 5

| | Hydrogen peroxide concentration μg/L | Gas environment in treatment chamber | Sheet resistance increase mΩ/sq./h |
|---|---|---|---|
| Example 1 | <2 | Air Atmosphere | 0.8 |
| Example 4 | <2 | Nitrogen atmosphere (oxygen gas 1.5%) | 0.5 |

As can be seen from Table 5, it is clear that corrosion can be prevented by cleaning the substrate with the carbonated water in which the concentration of hydrogen has been reduced to 2 μg/L or less and under the condition in which the nitrogen gas concentration was set to 2% or less in the treatment chamber, Example 5

Figure 24:
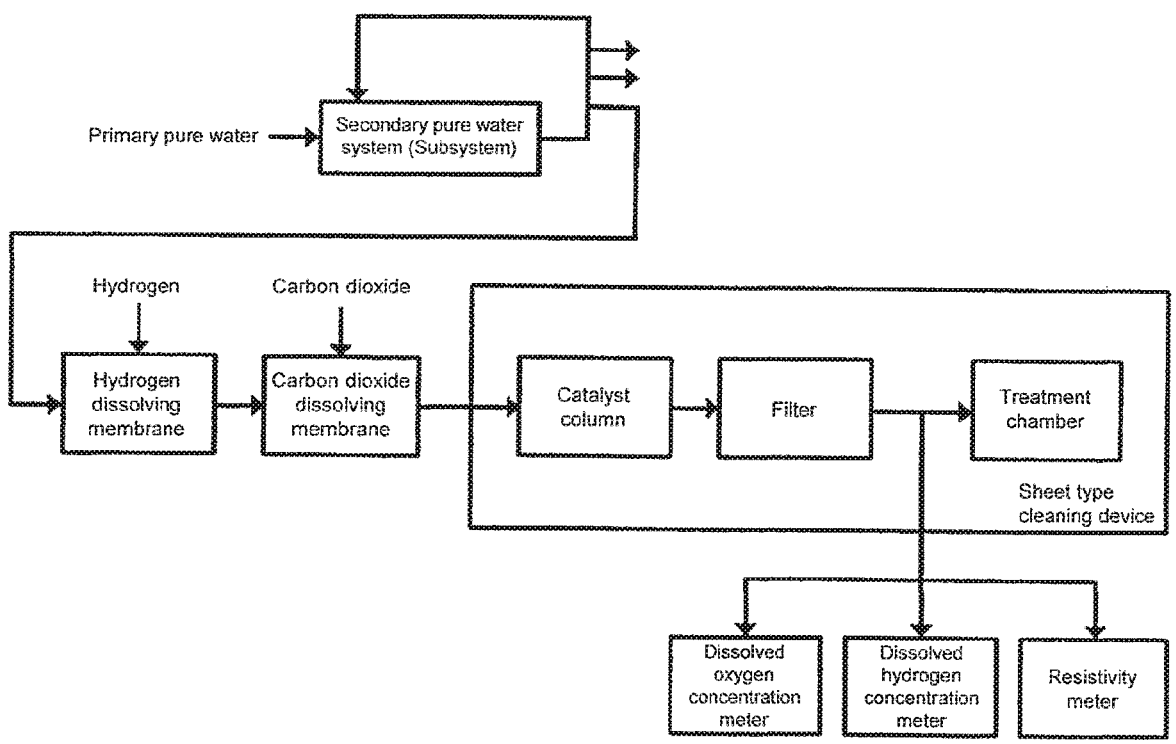
FIG. 24 is a schematic diagram showing an aspect of a test line according to Example 5.

This test was carried out by using a test line shown in FIG. 24. Hydrogen gas was dissolved in the secondary pure water (ultrapure water) of the ultrapure water production device by using a hydrogen dissolving membrane, and then carbon dioxide was dissolved therein by using a carbon dioxide dissolving membrane to set resistivity to 0.1 MΩ·cm. Carbonated water thus produced was introduced into the single wafer cleaning device. In the single wafer cleaning device, treatment water was passed through a catalyst column to remove hydrogen peroxide, passed through a microfiltration membrane, and then introduced into the treatment chamber to clean the sample for 2 hours. Table 5 shows the value per hour of the increase of the sheet resistance measured value after cleaning with respect to the sheet resistance measured value before the cleaning. The concentration of hydrogen peroxide included in treatment water in this case was 2 μg/L or less, the result of measuring the concentration of dissolved oxygen by extracting a part of the treatment water immediately upstream of the treatment chamber was 6 μg/L, and the concentration of dissolved hydrogen was 50 μg/L.

In may be thought that the concentration of dissolved oxygen was successfully reduced, because the dissolved oxygen was removed by the actions of the dissolved hydrogen and the catalyst, and because the treatment was performed in the cleaning device to prevent air from being dissolved through the pipe or the joints.

TABLE 6

| | Hydrogen peroxide concentration μg/L | Dissolved oxygen concentration μg/L | Sheet resistance increase mΩ/sq./h |
|---|---|---|---|
| Example 1 | <2 | 30 | 0.8 |
| Example 5 | <2 | 6 | 0.7 |

As can be seen from Table 6, it is clear that copper corrosion can be prevented by cleaning the substrate with the carbonated water in which, as the result of passing the water through the hydrogen peroxide removal catalyst after the addition of hydrogen, the concentration of hydrogen peroxide has been reduced to 2 or less and the concentration of dissolved oxygen has been reduced. It is clear that the installation location of the hydrogen peroxide removal catalyst is very close to the substrate treatment device, preferably inside the substrate treatment device, and more preferably immediately upstream of the treatment chamber.

Example 6

In the test of Example 5, a cleaning test was carried out by introducing nitrogen gas into the treatment chamber and under the condition in which the concentration of oxygen gas has been reduced to 2% or less. Table 7 shows the result.

TABLE 7

| | Hydrogen peroxide concentration μg/L | Gas environment in treatment chamber | Sheet resistance increase mΩ/sq./h |
|---|---|---|---|
| Example 5 | <2 | Air Atmosphere | 0.7 |
| Example 6 | <2 | Nitrogen atmosphere (oxygen gas 1.5%) | 0.4 |

As can be seen from Table 7, it is clear that when the substrate is cleaned with the carbonated water in which the concentration of hydrogen peroxide has been reduced to 2 μg/L or less and in which the concentration of dissolved oxygen has been reduced, corrosion can be prevented by cleaning the substrate under the condition in which the concentration of oxygen gas in the treatment chamber has been reduced to 2% or less.

Example 7

By using the test line of Example 1 and controlling the amount of added carbon dioxide, several types of carbonated water whose resistivities were in the range of 0.03 to 10.0 MΩ·cm and in which the concentration of hydrogen peroxide was 2 μg/L or less were obtained. As a sample to be cleaned, a silicon wafer in which a thermally-oxidized film was formed to be 200 nm was alternatively used and was cleaned with the several types of carbonated water, respectively, for 2 hours, and then surface potentials were measured. For the surface potential measurement, a surface potentiometer Model 244 made by Monroe Electronics Inc., was used. Table 8 shows the result

TABLE 8

| Measurement No. | Resistivity MΩ · cm | Surface potential V |
|---|---|---|
| 1 | 0.03 | <1 |
| 2 | 1.0 | <1 |
| 3 | 2.0 | <1 |
| 4 | 5.0 | <1 |
| 5 | 10.0 | 8 |

As can be seen from Table 8, it was found that when the carbonated ultrapure water in which the concentration of hydrogen peroxide has been reduced to 2 or less was used, the substrate was not charged as long as the resistivity was in the range of 0.03 to 5.0 MΩ·cm.

The present invention has been described by way of the Examples. The present invention, however, is not limited to these Examples, and may include design variations that are made therein without departing the scope of the invention. In other words, the present invention may include various changes and modifications that can be readily made therein by those skilled in the art.

REFERENCE SIGNS

1 Substrate treatment device
1a Water inlet of substrate treatment device
2 Hydrogen peroxide removal device
3 Main pipe
4 Carbon dioxide supply device
5 Hydrogen supply device
6 Membrane degasifier
10 Subsystem (secondary pure water system)
10a Water outlet of subsystem
11 Hydrogen water supply system
11a Water outlet of hydrogen water supply system
12 Carbonated water supply system
12a Water outlet of carbonated water supply system

The invention claimed is:

1. A system for cleaning a substrate having copper or a copper compound exposed on a surface with carbonated water, comprising:
 an ultrapure water producer that is configured to produce ultrapure water in which dissolved oxygen is limited to 2 μg/L or less, the ultrapure water producer including an ultraviolet oxidizer;
 a treatment chamber in which the substrate is disposed and to which the carbonated water is supplied; and
 a carbonated water producer that is configured to produce the carbonated water and that includes a hydrogen peroxide remover and a carbon dioxide supplier, the hydrogen peroxide remover disposed in a flow path connecting the ultraviolet oxidizer of the ultrapure water producer to the treatment chamber and configured to remove hydrogen peroxide from ultrapure water flowing through the flow path such that the hydrogen peroxide dissolved in the carbonated water is limited to 2 μg/L or less, the carbon dioxide supplier disposed in the flow path downstream of a water outlet of the ultrapure water producer and configured to add carbon dioxide to the ultrapure water such that a resistivity of the carbonated water is adjusted to be within a range of 0.03 to 5.0 MΩ·cm, so as to prevent charging of the substrate during cleaning with the carbonated water,
 wherein, immediately before the carbonated water is supplied to the treatment chamber, concentration of dissolved oxygen in the carbonated water is 6 μg/L or more and 130 μg/L or less.

2. The system according to claim 1, wherein the hydrogen peroxide remover is disposed in the flow path upstream of one or more of a membrane degasifier, a non-regenerative ion-exchange device, or a membrane separation device.

3. The system according to claim 2, comprising a hydrogen supplier that is disposed in the flow path between the ultraviolet oxidizer and the hydrogen peroxide remover and that is configured to supply hydrogen to water flowing through the flow path therebetween.

4. The system according to claim 1, comprising a hydrogen supplier that is disposed in the flow path between the water outlet of the ultrapure water producer and the hydrogen peroxide remover and that is configured to supply hydrogen to the ultrapure water.

5. The system according to claim 1, wherein the hydrogen peroxide remover includes a catalyst unit filled with a platinum-group metal catalyst.

6. The system according to claim 5, wherein the platinum-group metal catalyst is a palladium catalyst.

7. The system according to claim 5, wherein the platinum-group metal catalyst is a palladium catalyst that is supported on a monolithic organic porous anion exchanger.

\* \* \* \* \*